(12) United States Patent
Frost et al.

(10) Patent No.: US 11,784,077 B2
(45) Date of Patent: Oct. 10, 2023

(54) WAFER OVERLAY MARKS, OVERLAY MEASUREMENT SYSTEMS, AND RELATED METHODS

(71) Applicant: Micron Technology, Inc., Boise, ID (US)

(72) Inventors: Denzil S. Frost, Lehi, UT (US); Richard T. Housley, Boise, ID (US); David S. Pratt, Meridian, ID (US); Trupti D. Gawai, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 671 days.

(21) Appl. No.: 16/719,366

(22) Filed: Dec. 18, 2019

(65) Prior Publication Data

US 2021/0193493 A1    Jun. 24, 2021

(51) Int. Cl.
*H01L 23/544* (2006.01)
*H01L 21/68* (2006.01)
(Continued)

(52) U.S. Cl.
CPC .......... *H01L 21/681* (2013.01); *G06T 7/0004* (2013.01); *G06T 7/73* (2017.01);
(Continued)

(58) Field of Classification Search
CPC .......................... H01L 21/681; H01L 23/544
See application file for complete search history.

(56) References Cited

U.S. PATENT DOCUMENTS 5,982,044 A * 11/1999 Lin .................. H01L 23/544
257/E23.179
6,037,671 A * 3/2000 Kepler ............. H01L 23/544
257/E23.179
(Continued)

FOREIGN PATENT DOCUMENTS

CN        103913960 A      7/2014

OTHER PUBLICATIONS

Daw et al., High Temperature Irradiation-Resisitant Thermaocouple Performance Improvements, Idaho National Laboratory, Sixth American Nuclear Society International Topical Meeting on Nuclear Plant Instrumentation, Control, and Human-Machine Interface Technologies, (Apr. 5-9, 2009), 15 pages.

(Continued)

*Primary Examiner* — Nathan W Ha
(74) *Attorney, Agent, or Firm* — TraskBritt

(57) ABSTRACT

A method for determining overlay measurements includes orienting a wafer to align portions of lines of a pattern of an overlay mark with a direction in which a source emits light at the wafer and align other portions of the lines of the pattern to extend in a direction perpendicular to the direction in which the illumination source emits light at the wafer. The method includes capturing at least one image of the wafer via an imager sensor. The method also includes determining contrasts of regions of the overlay mark and determining a location of the overlay mark. Overlay marks include a pattern defining an array of columns. Each column includes a set of continuous lines oriented parallel to each other and extending in a first direction within a first region of a column and extending in a second different direction in a second region of the column.

19 Claims, 11 Drawing Sheets

(51) Int. Cl.
*G06T 7/00* (2017.01)
*G06T 7/73* (2017.01)
*G03F 7/00* (2006.01)

(52) U.S. Cl.
CPC ........ H01L 23/544 (2013.01); *G03F 7/70633* (2013.01); *G06T 2207/10056* (2013.01); *G06T 2207/30148* (2013.01); *H01L 2223/544* (2013.01); *H01L 2223/54426* (2013.01); *H01L 2223/54493* (2013.01)

(56) References Cited

U.S. PATENT DOCUMENTS

| | | | |
|---|---|---|---|
| 6,172,409 B1* | 1/2001 | Zhou | H01L 23/544 |
| | | | 257/E23.179 |
| 6,239,031 B1* | 5/2001 | Kepler | G03F 9/70 |
| | | | 438/692 |
| 6,778,275 B2 | 8/2004 | Bowes | |
| 6,779,171 B2 | 8/2004 | Baggenstoss | |
| 6,801,315 B2 | 10/2004 | Finarov et al. | |
| 7,009,704 B1 | 3/2006 | Nikoonahad et al. | |
| 7,046,361 B1 | 5/2006 | Yang et al. | |
| 7,295,305 B2 | 11/2007 | Yoshida et al. | |
| 7,463,367 B2 | 12/2008 | Bowes | |
| 9,523,927 B2 | 12/2016 | Maeda | |
| 10,461,038 B1* | 10/2019 | Housley | H01L 23/544 |
| 10,566,290 B2* | 2/2020 | Sun | G01B 21/24 |
| 10,859,924 B2* | 12/2020 | Wang | G03F 9/7003 |
| 2002/0130425 A1* | 9/2002 | Koike | H01L 23/544 |
| | | | 257/E23.179 |
| 2003/0002043 A1 | 1/2003 | Abdulhalim et al. | |
| 2003/0021467 A1* | 1/2003 | Adel | G06V 40/171 |
| | | | 382/145 |
| 2004/0032031 A1* | 2/2004 | Holscher | H01L 23/544 |
| | | | 257/E23.179 |
| 2004/0099963 A1* | 5/2004 | Holloway | H01L 23/544 |
| | | | 257/E23.179 |
| 2007/0052113 A1* | 3/2007 | Marokkey | G03F 9/7076 |
| | | | 257/E23.179 |
| 2008/0251951 A1* | 10/2008 | Holscher | H01L 23/544 |
| | | | 257/E23.179 |
| 2009/0195768 A1 | 8/2009 | Bijnen et al. | |
| 2012/0206729 A1 | 8/2012 | Seligson et al. | |
| 2013/0148120 A1* | 6/2013 | Okamoto | G03F 7/70633 |
| | | | 356/401 |
| 2013/0236835 A1* | 9/2013 | Lam | G03F 7/70475 |
| | | | 430/319 |
| 2016/0216613 A1* | 7/2016 | Lin | G03F 7/70141 |
| 2019/0033706 A1* | 1/2019 | Yu | G03F 1/70 |
| 2019/0067204 A1* | 2/2019 | Sun | G01B 21/20 |
| 2019/0146357 A1* | 5/2019 | Wang | G03F 7/705 |
| | | | 430/22 |
| 2020/0050102 A1* | 2/2020 | Yu | G03F 1/70 |
| 2020/0075432 A1* | 3/2020 | Mirin | H01L 21/682 |
| 2020/0110332 A1* | 4/2020 | Lee | G03F 9/7088 |
| 2022/0308440 A1* | 9/2022 | Sato | G03F 1/42 |

OTHER PUBLICATIONS

Greater Contrast and Improved Vision for Imaging Systems, Polarization can Improve Quality in Low Light Conditions and Provide a Major Benefit to Vision Applications, https://www.framos.com/en/news/greater-contrast-and-improved-vision-for-imaging-systems, (Jun. 13, 2018), 6 pages.

MEDTHERM Corporation, Measure Suface Termperature with a Response Time as Little as 1 Microsecond, Coaxial Surface Thermocouple Probes, Bulletin 500, www.techno-office.com > file > MED_TCS, (Oct. 2000), 4 pages.

Chinese First Office Action for Chinese Application No. 202011508435.9, dated Jul. 28, 2023, 11 pages with translation.

\* cited by examiner

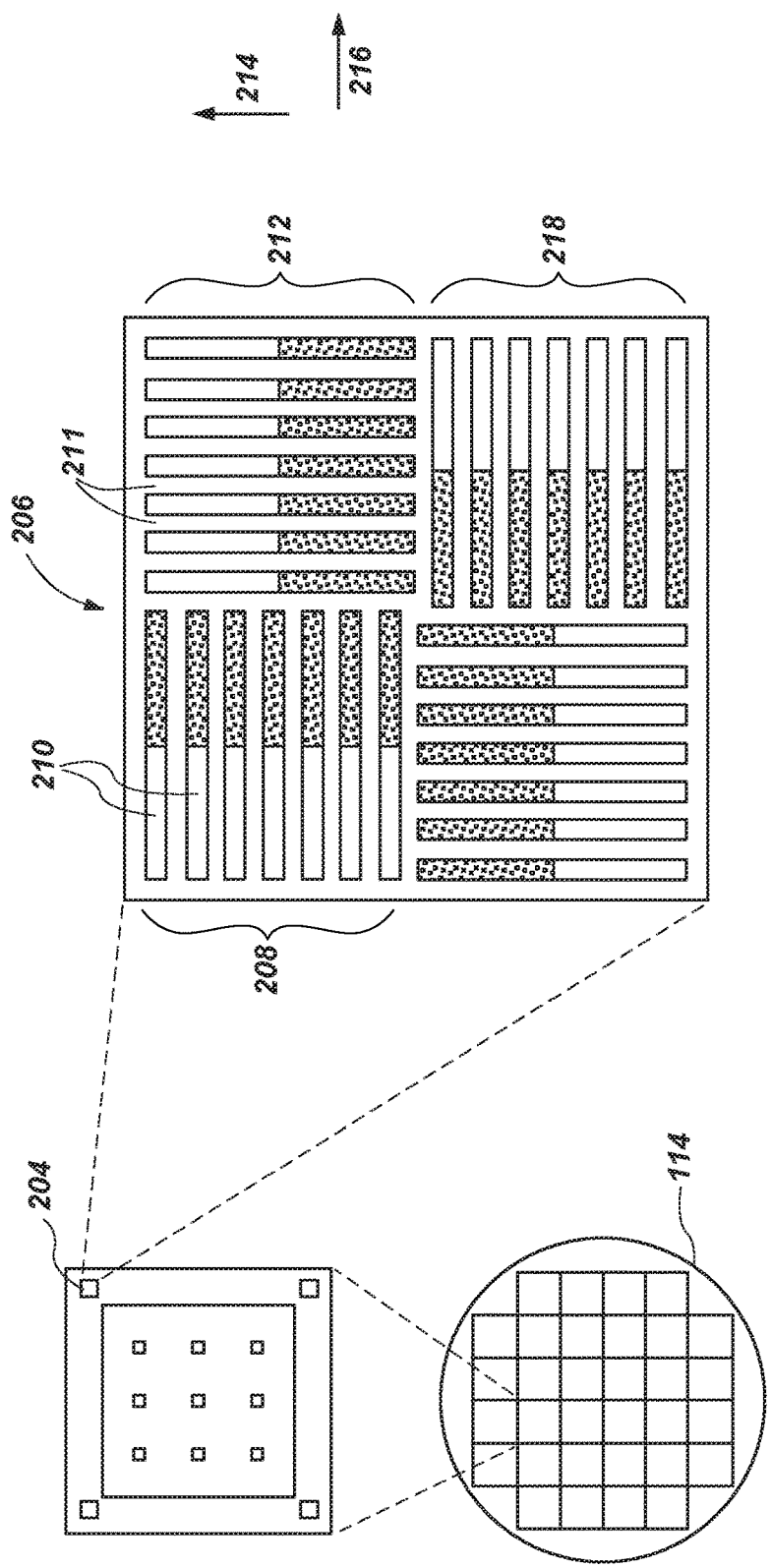

WAFER OVERLAY MARKS, OVERLAY MEASUREMENT SYSTEMS, AND RELATED METHODS

TECHNICAL FIELD

This disclosure relates generally to wafer overlay marks and overlay measurement systems. Additionally, this disclosure relates to overlay marks that include continuous patterns within minimal to no interruptions.

BACKGROUND

A photolithography apparatus is a machine that applies a desired pattern onto a substrate, usually onto a target portion of a bulk semiconductor substrate such as a semiconductor wafer. Photolithography apparatus can be used, for example, in the fabrication of semiconductor devices. In that instance, a patterning device, which is referred to in the art as a mask or a reticle, may be used to generate circuit patterns to be formed on die locations from an individual material level on an active surface of the wafer. This pattern can be transferred onto a target portion (e.g., including part of, one, or several die locations) on the wafer (e.g., a silicon wafer). Transfer of the pattern is typically effected via imaging onto a layer of radiation-sensitive material (i.e., photoresist) provided on the wafer. In general, a wafer will contain a grid of adjacent target portions corresponding to die locations that are successively patterned. In lithographic processes, it is often desirable to frequently make measurements of the features (i.e., structures) created and locations thereof on the wafer, e.g., for process control and verification. Various tools for making such measurements are known, including scanning electron microscopes, which are often used to measure critical dimension (CD), and tools to measure overlay, a measure of the accuracy of alignment of two layers in a semiconductor device. Overlay may be described in terms of the degree of misalignment between the two layers, for example reference to a measured overlay of 1 nm may describe a situation where two layers are laterally misaligned by 1 nm. Conventional optical methods of measuring overlay typically include using an optical microscope and measuring an optical spectrum and/or a diffraction pattern. Additional conventional optical methods of measuring overlay typically include measuring overlay with captured images from an optical microscope. Conventional overlay marks generally incorporate pattern interruptions (areas including no pattern) to generate optical contrast. However, the pattern interruptions are often damaged during processing, which adversely affects overlay measurements.

BRIEF DESCRIPTION OF THE DRAWINGS

For a detailed understanding of the present disclosure, reference should be made to the following detailed description, taken in conjunction with the accompanying drawings, in which like elements have generally been designated with like numerals, and wherein:

FIG. 2A is a simplified top view of a wafer according to one or more embodiments of the present disclosure;

FIG. 2B is a simplified top view of a portion of a wafer having overlay marks formed thereon according to one or more embodiments of the present disclosure;

FIG. 2C is a simplified view of an overlay mark as detected by an imager sensor according to one or more embodiments of the present disclosure;

DETAILED DESCRIPTION

Figure 1:
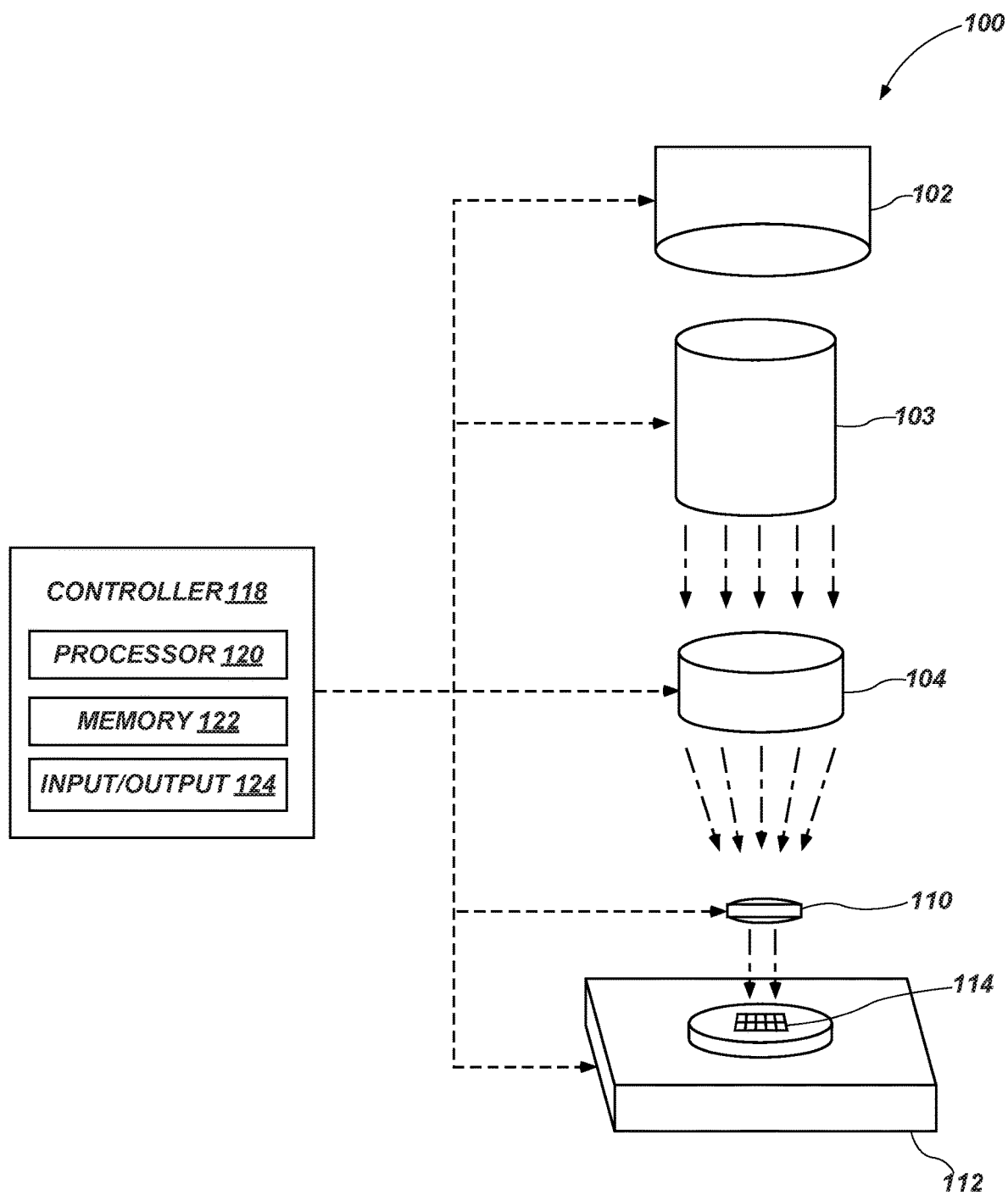
FIG. 1 illustrates a schematic diagram of an overlay metrology measurement system according to one or more embodiments of the present disclosure.

The illustrations presented herein are not actual views of any overlay measurements system, overlay mark, or any component thereof, but are merely idealized representations, which are employed to describe embodiments of the present invention.

As used herein, the singular forms following "a," "an," and "the" are intended to include the plural forms as well, unless the context clearly indicates otherwise.

As used herein, the term "may" with respect to a material, structure, feature, or method act indicates that such is contemplated for use in implementation of an embodiment of the disclosure, and such term is used in preference to the more restrictive term "is" so as to avoid any implication that other compatible materials, structures, features, and methods usable in combination therewith should or must be excluded.

As used herein, any relational term, such as "first," "second," "above," "upper," etc., is used for clarity and convenience in understanding the disclosure and accompanying drawings, and does not connote or depend on any specific preference or order, except where the context clearly indicates otherwise. For example, these terms may refer to orientations of elements of an overlay measurement system, an overlay mark, wafer, and/or wafer vice in conventional orientations. Furthermore, these terms may refer to orientations of elements of an overlay measurement system, an overlay mark, wager, and/or wafer vice as illustrated in the drawings.

As used herein, the term "substantially" in reference to a given parameter, property, or condition means and includes to a degree that one skilled in the art would understand that the given parameter, property, or condition is met with a small degree of variance, such as within acceptable manufacturing tolerances. By way of example, depending on the particular parameter, property, or condition that is substantially met, the parameter, property, or condition may be at least 90.0% met, at least 95.0% met, at least 99.0% met, or even at least 99.9% met.

As used herein, the term "about" used in reference to a given parameter is inclusive of the stated value and has the meaning dictated by the context (e.g., it includes the degree of error associated with measurement of the given parameter, as well as variations resulting from manufacturing tolerances, etc.).

As used herein, the term "wafer" means and includes materials upon which and in which structures including feature dimensions of micrometer and nanometer scale are partially or completely fabricated. Such materials include conventional semiconductor (e.g., silicon) wafers, as well as bulk substrates of other semiconductor materials as well as other materials. For the sake of convenience, such materials will be referenced below as "wafers." Example structures formed on such materials may include, for example, integrated circuitry (active and passive), MEMS devices, and combinations thereof.

Many details of certain embodiments are described below with reference to semiconductor devices. The term "semiconductor device" is used throughout to include a variety of articles of manufacture, including, for example, individual integrated circuit dies, imager dies, sensor dies, and/or dies having other semiconductor features. Embodiments of the apparatus and processes described below may be used to measure overlay between level of materials comprising components of integrated circuitry on a wafer and, thus of an individual die or dice to be singulated from the wafer. The wafer (e.g., semiconductor device forms) may be unsingulated silicon comprising die locations, or a carrier wafer repopulated with previously singulated dice. The repopulated carrier wafer can include an adhesive molding material (e.g., a flexible adhesive), which is surrounded by a generally rigid frame having a perimeter shape comparable to that of device wafer, and laterally separated singulated elements (e.g., dies) surrounded by the molding material.

Some embodiments of the present disclosure include overlay metrology measurement systems configured for determining an overlay measurement (e.g., measuring overlay) between an interest level of a wafer and a reference level of the semiconductor device substrate, such as a wafer or other bulk substrate comprising semiconductor material. The overlay metrology measurement system may utilize an optical microscope imaging or scatterometry system to determine locations of overlay marks (e.g., optically detectable overlay marks) on a level of interest (referred to herein as an "interest level") of the semiconductor device (e.g., a top material level of the semiconductor device overlying one or more other levels). For instance, the registration system may utilize the optical microscope imaging or scatterometry system to determine locations of overlay marks or other elements, such as conductive via ends, on an exposed surface of a wafer or through a transparent or semitransparent material via optical methods. Furthermore, although a specific optical microscope imaging or scatterometry system is described herein, the disclosure is not so limited, and the overlay metrology measurement systems may include any conventional optical scanner for locating visible overlay markers and performing overlay measurements. Additionally, the overlay metrology measurement systems may utilize the optical microscope imaging or scatterometry system to determine locations of overlay marks disposed within a lower level of the wafer (e.g., referred to herein as a "reference level"). Furthermore, based on the determined locations of the overlay mark of the reference level and the overlay mark of the interest level, the overlay metrology measurement system may determine calculate a positional offset (e.g., and overlay measurement) between the interest level and the reference level of the wafer.

One or more embodiments of the present disclosure include a method of determining an overlay measurement (e.g., a positional offset) between an interest level of a wafer and a reference level of the wafer. The method may include orienting a wafer (e.g., rotating a wafer on a wafer chuck) within an overlay metrology measurement system to align portions of lines of a pattern of an overlay mark with a direction in which an illumination source of the overlay metrology measurement system emits light (e.g., radiation) at the wafer. Furthermore, orienting the wafer may include aligning other portions of the lines of the pattern of the overlay mark to extend in a direction perpendicular to the direction in which the illumination source of the overlay metrology measurement system emits light at the wafer. The method further includes emitting light at the wafer via the illumination source, and capturing at least one image of the wafer via an imager sensor of the overlay metrology measurement system. The method also includes determining, based at least partially on the captured at least one image, contrasts of regions of the overlay mark and based on the determined contrasts determining a location of the overlay mark. Moreover, the method may include determining a location of an overlay mark of a reference level of the wafer and a location of an overlay mark of an interest level of the wafer via the above-described method. Furthermore, based on the determined locations of the overlay marks, the overlay metrology measurement system may determine a positional offset between the reference level and the interest level of a wafer.

Some embodiments of the present disclosure include an overlay mark utilized to determine a positional offset between the reference level and the interest level of a wafer. The overlay mark may include a pattern defining an array of columns, each column comprising a set of parallel bar marks wherein each bar mark is spaced apart from an adjacent bar mark by a space mark. Furthermore, the pattern within each column of the array of columns may include a set of lines oriented parallel to each other and extending in a first direction within each bar mark of a respective column and extending in a second different direction in each space mark of the respective column. Each line of the set of lines may be continuous and may extend from an uppermost region of the respective column to a lowermost region of the respective column. Furthermore, the first direction may be perpendicular to the second direction.

The overlay marks and patterns for forming overlay marks described herein are advantageous over conventional overlay marks and patterns. For example, conventional overlay marks typically include interruptions in the pattern (e.g., absences of pattern) to assist in differentiating between portions of the pattern (e.g., bar marks) when detected optically. However, these interruptions (or the edges of the pattern defining the interruptions) are commonly damaged during conventional processing procedures. The damaged interruptions adversely affect subsequent overlay measurements. The overlay marks and patterns for forming overlay marks of the present disclosure, however, do not include the above-described interruptions and are at least substantially continuous. Furthermore, due to the shape and design of the patterns described herein, the patterns maintain a detectability and differentiability (e.g., optical contrast) of portions of the patterns when scanned via an imager system. Therefore, because the overlay marks and patterns for forming overlay marks of the present disclosure remove any need for interruptions for detecting portions of the overlay marks, the overlay marks and patterns for forming overlay marks of the present disclosure may provide more robust and reliable overlay marks that may endure subsequent processing better than conventional overlay marks. Accordingly, the overlay marks and patterns for forming overlay marks of the present disclosure may result in more accurate overlay measurements, which results in better processing and higher quality semiconductor devices.

FIG. 1 is a schematic view of an overlay metrology measurement system 100 according to one or more embodiments of the present disclosure. As shown the overlay metrology measurement system 100 may be configured as a photolithography system with additional components as described herein, although the disclosure is not so limited. The overlay metrology measurement system 100 can be used to align semiconductor devices, determine overlay measurements of a wafer and perform registration (e.g., alignment) operations on an in-process semiconductor wafer with respect to processing tools, and if configured for an additional function, for example photolithographic exposure of a material through a reticle, perform processes for semiconductor fabrication on the wafer. Thus it will be appreciated that the present technology is not limited to overlay metrology measurement systems per se, but is also applicable to semiconductor processing tools that require accurate overlay measurements of wafers. As a non-limiting example, the present technology can also be used in processes and systems for proper alignment in laser cutting and drilling tools, saws, 3-D printing tools, and other processes that necessitate overlay marks and overlay measurements between various materials (e.g., levels) of in-process wafers. For purposes of illustration, the overlay metrology measurement system 100 includes an optical microscope imaging or scatterometry system including an image sensor 102, an illumination source 103, a condenser lens 104, polarizer 110, and a substrate support 112 arranged in series. As noted, some of the foregoing components enable overlay metrology measurement system 100 to perform processing acts.

As shown in FIG. 1, a controller 118 may be operatively coupled to the image sensor 102, the illumination source 103, the condenser lens 104, the polarizer 110, and the substrate (e.g., wafer) support 112 of the overlay metrology measurement system 100 for monitoring or controlling the operation of these components. Although not shown in FIG. 1, the overlay metrology measurement system 100 may also include a substrate transport station, structural supports (e.g., a polarizer support, etc.), position sensors (e.g., a scatterometer), an immersion hood, a support actuator (e.g., an electric motor), and/or other suitable mechanical and/or electrical components. In general, the controller 118 may be configured to control movement of a wafer and/or components of the overlay metrology measurement system 100 before, during, and/or after a semiconductor fabrication process. For example, a wafer 114 can undergo photoresist deposition, patterning via a light source and a reticle, developing, baking, cleaning, and/or other suitable processing, and the overlay metrology measurement system 100 may be used to measure overlay and/or align the wafer 114 and/or tools or other components associated with the overlay metrology measurement system 100 before, during, and/or after these processes.

The controller 118 may include a processor 120 coupled to a memory 122 and an input/output component 124. The processor 120 may include a microprocessor, a field-programmable gate array, and/or other suitable logic devices. The memory 122 may include volatile and/or nonvolatile media (e.g., ROM, RAM, magnetic disk storage media, optical storage media, flash memory devices, and/or other suitable storage media) and/or other types of computer-readable storage media configured to store data. The memory 122 may store algorithms for alignment, edge detection, filters, shape recognition, determining optical contrasts detected by the image sensor 102 for execution by the processor 120. In some embodiments, the processor 120 may be configured to send data to a computing device operatively coupled (e.g., over the Internet) to the controller 118, such as a server or personal computer. The input/output component 124 may include a display, a touch screen, a keyboard, a mouse, and/or other suitable types of input/output devices configured to accept input from and provide output to an operator.

In some embodiments, the overlay metrology measurement system 100 may utilize the image sensor 102 to capture light reflected from a wafer and send the captured image data to the controller 118, where it is stored in the memory 122, processed by the processor 120, and/or sent to the input/output component 124. In some embodiments, the image sensor 102 may be configured to capture radiation that is not in the visible spectrum, such as UV light or infrared radiation. Alternatively, the image sensor 102 may be configured to capture imaging data of a wafer in both the visible and nonvisible radiation spectrums and send this imaging data to the controller 118. Although not shown in FIG. 1, the image sensor 102 may include a lens, aperture, image sensing component, digital signal processor, and analog or digital output. Although the image sensor 102 is shown above the illumination source 103 in FIG. 1, in some embodiments the image sensor 102 can be spaced laterally apart from the substrate support 112, and a mirror can be positioned to reflect light representative of the wafer surface topography into the image sensor 102.

Also, the illumination source 103 may include an ultraviolet light source (e.g., a fluorescent lamp), a laser source (e.g., an argon fluoride excimer laser), and/or other suitable electromagnetic radiation emission sources. In certain embodiments, the illumination source 103 may be configured to produce generally coherent illumination at a single frequency. In other embodiments, the illumination source 103 may also be at least partially incoherent. In further embodiments, the illumination source 103 may also be configured to generate illumination at multiple frequencies.

The condenser lens 104 and the polarizer 110 may be used to project radiation (e.g., a pattern of radiation) onto the wafer 114. In some embodiments, the polarizer 110 may be configured to polarize radiation (e.g., light) from the illumination source 103 prior to the radiation reaching the wafer 114. For example, the overlay metrology measurement system 100 may include at least a portion of the optical scanner described in U.S. Pat. No. 9,748,128, to Chao et al., issued Aug. 29, 2017.

As is discussed in greater detail below, the overlay metrology measurement system 100 may utilize the optical microscope imaging or scatterometry system (e.g., image sensor 102) to determine locations of overlay marks (e.g., optically detectable overlay marks) on a level of interest (referred to herein as an "interest level") of the semiconductor device (e.g., a top material level of the semiconductor device overlying one or more other levels). For instance, the overlay metrology measurement system 100 may utilize the optical microscope imaging or scatterometry system (e.g., image sensor 102) to determine locations of overlay marks or other elements, such as conductive via ends, on an exposed surface of a wafer or through a transparent or semitransparent material via conventional optical methods. Furthermore, although a specific optical microscope imaging or scatterometry system (e.g., image sensor 102) is described herein, the disclosure is not so limited, and the overlay metrology measurement system 100 may include any convention optical scanner for locating visible overlay marks and performing overlay measurements.

Furthermore, the overlay metrology measurement system 100 may utilize the determined locations of the overlay marks within the reference level of the wafer 114 and the determined locations of the overlay marks in the interest level (acquired via the optical microscope imaging or scatterometry system) to calculate a positional offset (i.e., an overlay measurement) between the interest level and the reference level.

The substrate support 112 may be configured to carry and/or move the wafer 114. The substrate support 112, which may also be characterized as a platform or a stage, may include a vacuum chuck, a mechanical chuck, and/or other suitable supporting devices. Although not shown in FIG. 1, the overlay metrology measurement system 100 may include at least one actuator configured to move the substrate support 112 laterally (as indicated by the X-axis), transversely (as indicated by the Y-axis), and/or vertically (as indicated by the Z-axis) relative to the response sensor 132 and/or other components of the photo overlay metrology measurement system 100. As used herein, the X-axis, Y-axis, and Z-axis as depicted in FIG. 1 define a Cartesian space. In certain embodiments, the substrate support 112 can also include position monitors (not shown) such as linear encoders, configured to monitor the position of the substrate support 112 along the X-axis, the Y-axis, and/or the Z-axis. In addition, a rotary encoder may be employed to monitor a rotational position of the wafer about the Z-axis. Even though only one substrate support 112 is shown in FIG. 1, in certain embodiments, the overlay metrology measurement system 100 can include two, three, or any desired number of substrate supports with structures and/or functions that are generally similar to or different than the substrate support 112, so that multiple wafers may be moved into and out of alignment with the remainder of the metrology measurement system 100 in an expedited fashion. In operation, the controller 118 may be used to position the substrate support 112 to properly align the wafer 114 with tools or other components associated with the overlay metrology measurement system 100 according to aspects of the present disclosure.

FIG. 2A is a schematic top view of a wafer 114 according to one or more embodiments of the present disclosure. FIG. 2B is an enlarged schematic view of a portion of the wafer 114 (e.g., a semiconductor device, a singulated portion of the wafer 114, etc.) having one or more overlay marks 204 formed thereon according to one or more embodiments of the present disclosure. FIG. 2C is an enlarged schematic view of an overlay mark 204 as detected via an optical imager system (e.g., imager sensor 102) according to one or more embodiments of the present disclosure.

Referring to FIGS. 2A-2C together, in some embodiments, the overlay mark 204 may be formed on a reference levels and or interest levels of the wafer 114. For instance, a reference level of the wafer 114 may include a first set of overlay marks 204 disposed within the reference level of the wafer 114, and the interest level may include a second set of overlay marks 204 formed in or on the interest level of the wafer 114. In some embodiments, one or more additional levels may be disposed between the interest level and the reference level. Furthermore, as is known in the art, an overlay measurement may be made by determining a centroid of overlay mark 204 on the reference level and a centroid of a correlating overlay mark 204 on the interest level and determining an offset between the centroids.

In one or more embodiments, each overlay mark 204 may include a pattern of material and/or absence of material defining an array 206 of columns 208 including a set of parallel bar marks 210 extending in a direction perpendicular to a height of a respective column 208 and having space marks 211 defined between adjacent bar marks 210. In other words, each column 208 may include a stack of bar marks 210 and space marks 211. In some embodiments, an upper region 212 of the overlay mark 204 may include one or more columns 208 (e.g., two adjacent columns) extending in a first direction 214 (vertical in the orientation depicted in FIG. 2C) and one or more columns (e.g., two adjacent columns) extending in a second direction 216 (horizontal in the orientation depicted in FIG. 2C). Furthermore, a lower region 218 of the overlay mark 204 may also include one or more columns 208 (e.g., two adjacent columns) extending in the first direction 214 (vertical in the orientation depicted in FIG. 2C) and one or more (e.g., two adjacent columns) extending in the second direction 216 (horizontal in the orientation depicted in FIG. 2C). The overlay marks 204, columns 208, bar marks 210, and space marks 211 are described in greater detail below in regard to FIGS. 3A-5D.

In one or more embodiments, the overlay marks 204 may comprise (e.g., may be formed from) conventional materials utilized for overlay marks 204 detectable and visible via conventional optical scanners. Furthermore, the overlay marks 204 may be formed via conventional systems. For example, the overlay marks 204 may include one or more of fill material, recesses, plating, or any other structure types conventionally utilized in forming overlay marks 204. However, as is discussed in further detail in regard to FIGS. 3A-5D, the structures and patterns utilized to form the overlay marks 204 of the present disclosure may minimize interruptions in the patterns while maintaining contrast (i.e., optical contrast) variability within the overlay marks 204, which improves a durability of the overlay marks while maintaining a detectability of the overlay mark.

Figures 3A, 3B:
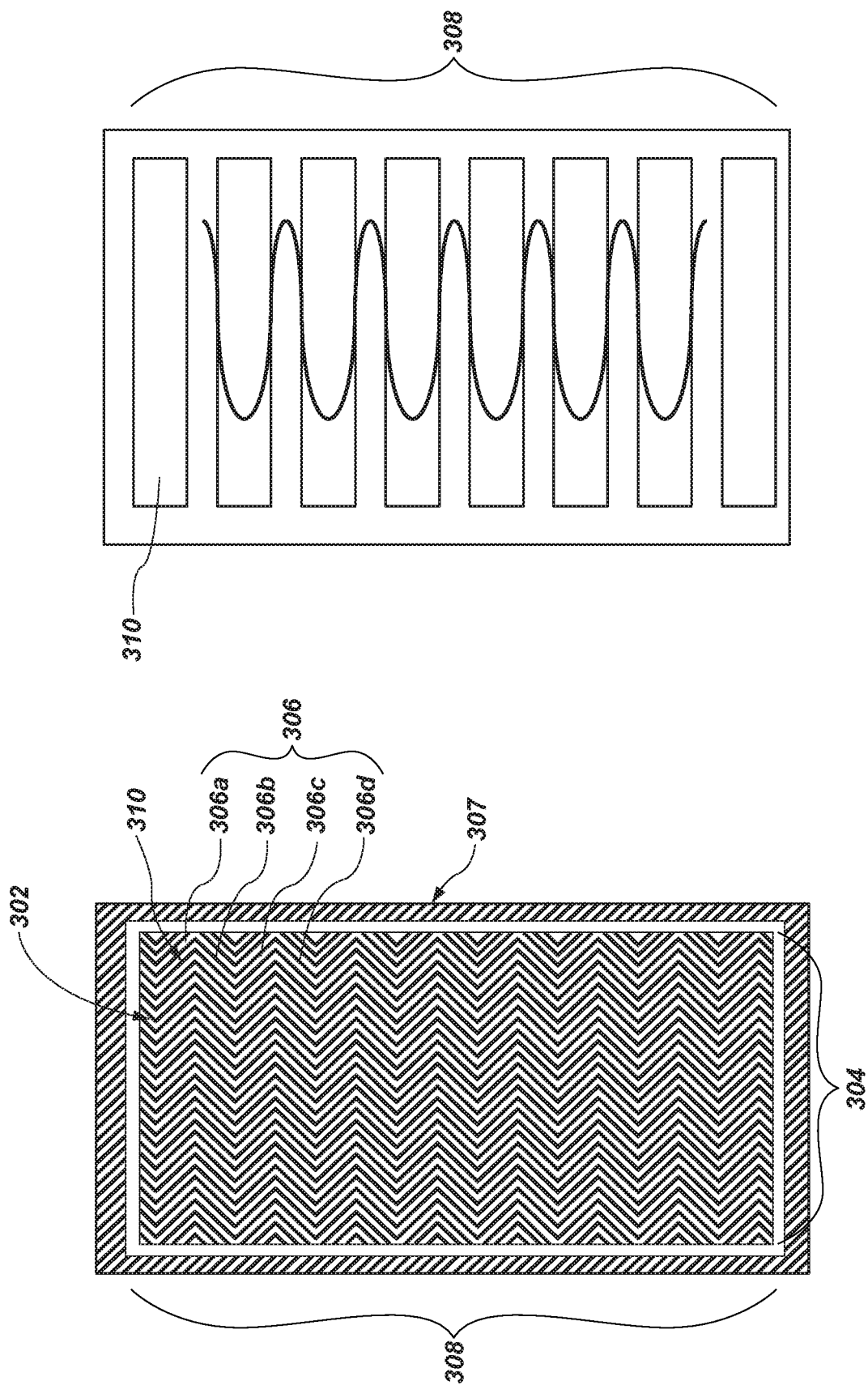
FIG. 3A is a schematic view of a pattern of a portion (e.g., a column) of an overlay mark according to one or more embodiments of the present disclosure.
FIG. 3B is a schematic representation of a contrast curve as determined by an overlay metrology measurement system.

FIG. 3A shows an example pattern 302 (e.g., a light space pattern) defining bar marks 310 of a column 308 of an overlay mark. FIG. 3B shows an example contrast curve that may be detected from the overlay mark of FIG. 3A via an imaging system (e.g., the imager sensor 102 of FIG. 1) and via image capturing and image analysis. The pattern 302 may be formed on (e.g., transferred to) the wafer 114 via any conventional methods (e.g., material deposition). In one or more embodiments, the pattern 302 may include a set of lines 304 oriented parallel to each other. The set of lines 304 may define adjacent regions 306a, 306b, 306c, 306d, etc., along a length of a height of the column 308. In some embodiments, the set of lines 304 may extend longitudinally at a first angle relative to a longitudinal axis of the column 308 within a first region 306a, and the set of lines 304 may extend longitudinally at a second angle relative to the longitudinal axis of the column 308 within an adjacent region 306b. In some embodiments, the first angle may be 45° and the second angle may be 135°. In view of the foregoing, the set of lines 304 may extend in a first direction within the first region 306a and a second, different direction in the second, adjacent region 306b where the first direction is perpendicular to the second, different direction. Furthermore, the angle at which the lines 304 extend may alternate between regions 306. In view of the foregoing, each line of the set of lines 304 may have a periodic shape.

Referring still to FIG. 3A, as is described in further detail below, the overlay metrology measurement system 100 may utilize polarization (and/or polarizing effects) for detecting and differentiating between portions of the pattern 302. In particular, in operation, the overlay metrology measurement system 100 (e.g., the illumination source 103 of the overlay metrology measurement system 100) may emit light at the wafer 114 in a direction parallel to the direction in which the set of lines 304 extend within the second, adjacent region 306b (or the first region 306a) of the pattern 302. As a result, the set of lines 304 within the first region 306a (or the second, adjacent region 306b) may extend in a direction perpendicular to direction in which the light is emitted at the wafer 114. Furthermore, having portions of the set of lines 304 extending in a direction parallel to the direction in which light is emitted at the wafer 114 and other portions of the set of lines 304 extending a direction perpendicular to direction in which the light is emitted at the wafer 114 may create a polarizing effect in the light detected imager sensor of the overlay metrology measurement system 100. For instance, the pattern 302 of the overlay mark may act as a polarizing filter and/or have a polarizing effect on the reflected light. In such embodiments, light being emitted at the wafer 114 in a direction parallel to the set of lines 304 is reflected back and/or diffracted normally while light be emitted at the wafer 114 in a direction perpendicular to the set of lines 304 is at least partially absorbed and/or reflected back and/or diffracted differently creating a difference in detected contrasts between portions of the set of lines 304. In view of the foregoing, via polarization, the overlay metrology measurement system 100 changes a detectable contrast of the second, adjacent region 306b (or the first region 306a) below or near below a detectable level and changes a detectable contrast of the first region 306a (or the second, adjacent region 306b) to an increased level.

In one or more embodiments, the overlay metrology measurement system 100 may emit linear polarized light at the wafer 114. In additional embodiments, the overlay metrology measurement system 100 may include a polarizing filter to polarize reflected light detected by the imager sensor 102. In yet further embodiments, the portions of the light reflected by the wafer 114 may be polarized (e.g., polarized by reflection).

In view of the foregoing, a first level of contrast may be identified (e.g., detected) in the area where the set of lines 304 (e.g., the collection of bar marks) extend in a direction perpendicular to a direction in which the light is emitted at the wafer 114, and a second level of contrast may be identified (e.g., detected) in the area where the set of lines 304 (e.g., the collection of bar marks) extend in a direction parallel to the direction in which the light is emitted at the wafer 114. Thus, as is described in greater detail herein, areas where the lines 304 of the pattern 302 defining the collection of bar marks (e.g., the column 308) extend in the first direction may be differentiated from areas where the lines 304 of the pattern 302 defining the collection of bar marks extend in the second direction when detected via the imager sensor 102. For instance, an example contrast curve that may be detected by the overlay metrology measurement system 100 scanning the overlay mark of FIG. 3A during a scanning procedure is depicted in FIG. 3B. Moreover, as is described in greater detail below, utilizing the contrast curves of each of the columns 308 of the overlay mark, the overlay metrology measurement system 100 may determine a location of a centroid of the overlay mark and may utilize the location of the centroid in making overlay measurements between levels of the wafer 114.

In view of the foregoing, in operation, the illumination source 103 may emit light at the wafer 114, and the image sensor 102 (e.g., optical microscope) may detect (e.g., capture) an image of the overlay mark (e.g., the light returning to the image sensor 102). Furthermore, the overlay metrology measurement system 100 may measure/determine a level of contrast across a scan distance by analyzing the image of the overlay mark to determine the contrast curve via conventional methods. In one or more embodiments, a region 306a having lines 304 extending at the first angle may be detected as a first area having a first contrast, wherein the first area has a same shape as the shape of the region 306a, and a region 306b having lines 304 extending at the second angle may be detected as a second area having a second, different contrast, wherein the second area has a same shape as the shape of the region 306b. As a result of the different contrasts, the shape and location of the regions 306 may be detected and determined, and, as is discussed in greater detail below, a shape and location of the overlay mark (e.g., the collection of columns depicted in FIG. 2C) may be detected and determined. Furthermore, in some instances, when lines defining an outer fill portion 307 (e.g., an area around and spaced apart from the column 308) extend in direction parallel to the direction in which the light is emitted at the wafer 114, the outer fill portion 307 may become undetectable or near undetectable via contrast detection.

Referring still to FIG. 3A, in some embodiments, one or more of the regions 306 of the pattern 302 of the overlay mark may be detected as bar marks 310 (e.g., the bar marks 210 depicted in FIG. 2C) by the overlay metrology measurement system 100. For instance, in some embodiments, regions 306 having lines 304 extending at the first angle may be detected as bar marks 310 (e.g., shapes similar to the bar marks 310), and regions 306 having lines 304 extending at the second angle may be detected as spaces between bar marks 310.

In one or more embodiments, the regions 306 may have at least substantially equal widths along a direction of the height of the column 308. Furthermore, at least some of the lines 304 may be at least substantially continuous from an uppermost region to a lowermost region of the regions 306. For instance, at least some of the lines 304 may extend from one longitudinal end of the column 308 to the other longitudinal end of the column 308. As a result, the pattern 302 may be at least substantially continuous from an uppermost region to a lowermost region of the column 308. In one or more embodiments, the regions 306 (e.g., the pattern of the overlay mark) may be separated from a remainder of a pattern of the wafer 114 by an interruption in the pattern (e.g., an absence of any pattern).

Figure 4B:
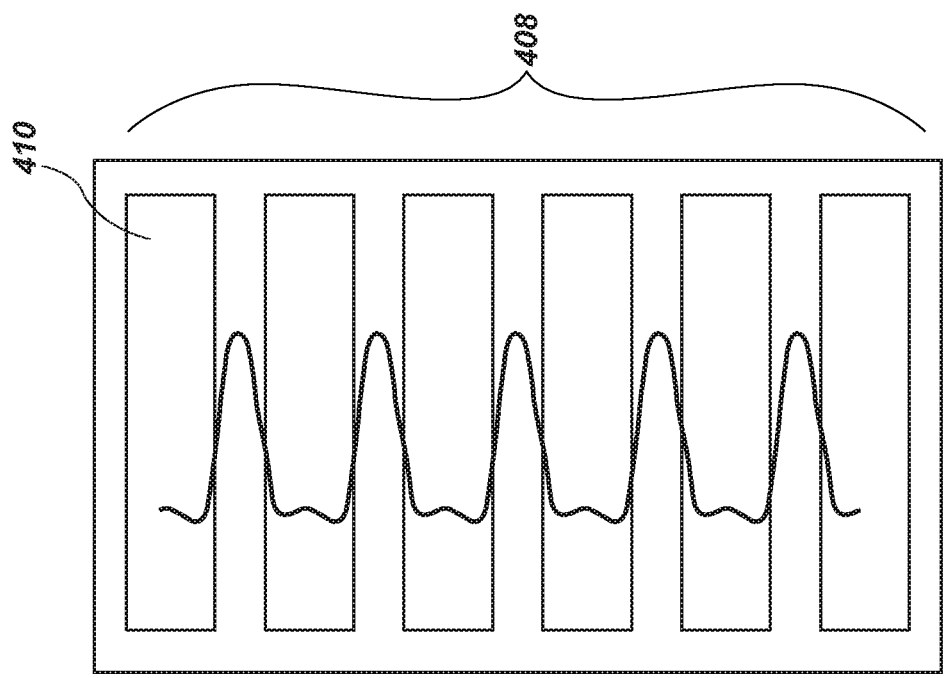
FIG. 4B is a schematic representation of a contrast curve as determined by an overlay metrology measurement system.
Figure 4A:
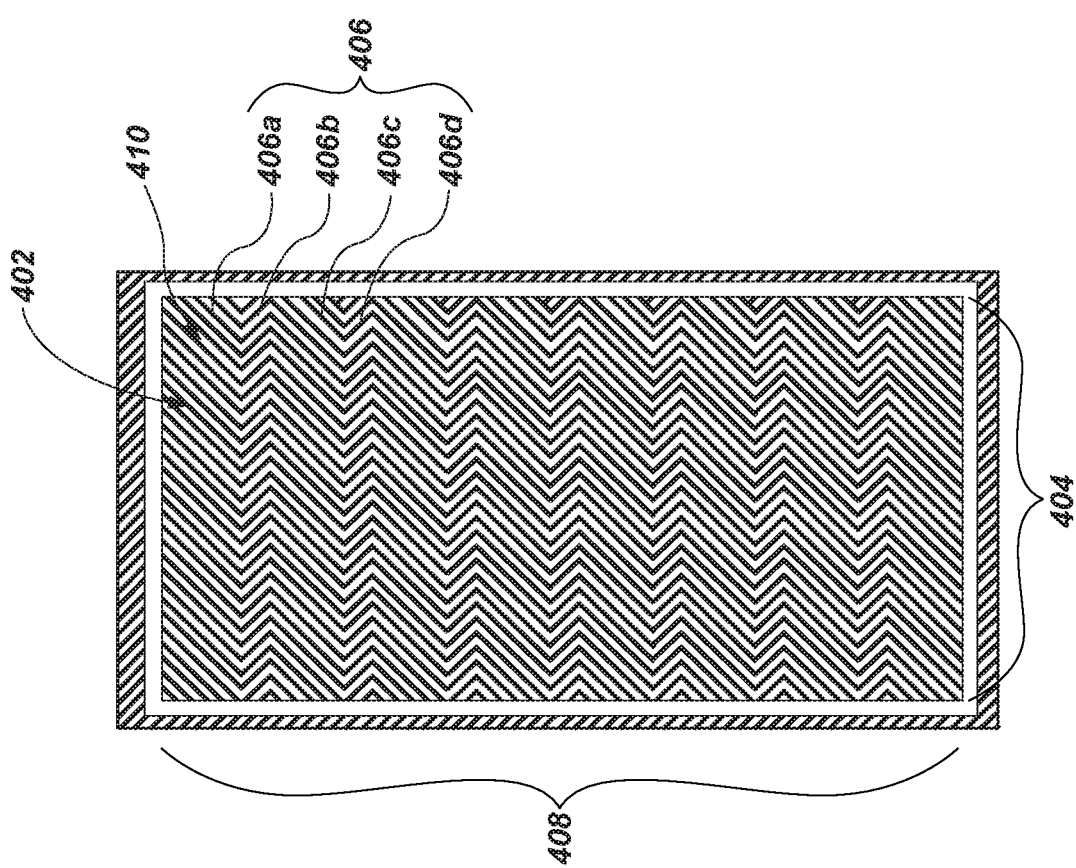
FIG. 4A is a schematic view of a pattern of a portion (e.g., a column) of an overlay mark according to one or more embodiments of the present disclosure.

FIG. 4A shows an example pattern 402 (e.g., a light space pattern) defining bar marks 410 of a column 408 of an overlay mark. FIG. 4B shows an example contrast curve that may be detected from the overlay mark of FIG. 4A via an imager system (e.g., the imager sensor 102 of FIG. 1). Similar to the pattern 302 described above in regard to FIGS. 3A and 3B, the pattern 402 may be formed on (e.g., transferred to) the wafer 114 via any conventional method, and the pattern 402 may include a set of lines 404 oriented parallel to each other. The set of lines 404 may define adjacent regions 406a, 406b, 406c, 406d, etc., along a length of a height of the column 408. In some embodiments, the set of lines 404 may extend longitudinally at a first angle relative to a longitudinal axis of the column within a first region 406a, and the set of lines 404 may extend longitudinally at a second angle relative to the longitudinal axis of the column within an adjacent region 406b. In some embodiments, the first angle may be 45° and the second angle may be 135°. In view of the foregoing, the set of lines 404 may extend in a first direction within the first region 406a and a second, different direction in the adjacent region 406b where the first direction is perpendicular to the second, different direction. Furthermore, the angle at which the lines 404 extend may alternate between regions 406. In view of the foregoing, each line of the set of lines 404 may have a periodic shape.

In the same manner as is described above in regard to FIGS. 3A and 3B, the overlay metrology measurement system 100 may utilize polarization (and/or polarizing effects) for detecting the pattern 402. For instance, the overlay metrology measurement system 100 may utilize polarization for detecting contrast levels of the regions 406a, 406b, 406c, 406d, etc., of the set of lines 404, and may determine a contrast curves representative of the column 408.

In some embodiments, one or more of the regions 406 of the pattern 402 may be detected as bar marks 410 by the overlay metrology measurement system 100. For instance, in some embodiments, regions 406 having lines 404 extending at the first angle may be detected as bar marks 410, and regions 406 having lines 404 extending at the second angle may be detected as spaces between bar marks 410.

In one or more embodiments, the regions 406 representing bar marks 410 may have at least substantially equal widths along a direction of the height of the column 408. Furthermore, regions 406 between the regions 406 representing bar marks 410 (i.e., space regions) may have widths smaller than the widths of the regions 406 representing bar marks 410. Furthermore, at least some of the lines 404 may be at least substantially continuous from an uppermost region to a lowermost region of the regions 406. For instance, at least some of the lines 404 may extend from one longitudinal end of the column 408 to the other longitudinal end of the column 408. As a result, the pattern 402 may be at least substantially continuous from an uppermost region to a lowermost region of the column 408. In one or more embodiments, the regions 406 (e.g., the pattern 402 of the overlay mark) may be separated from a remainder of a pattern of the wafer 114 by an interruption in the pattern 402 (e.g., an absence of any pattern).

Figure 5B:
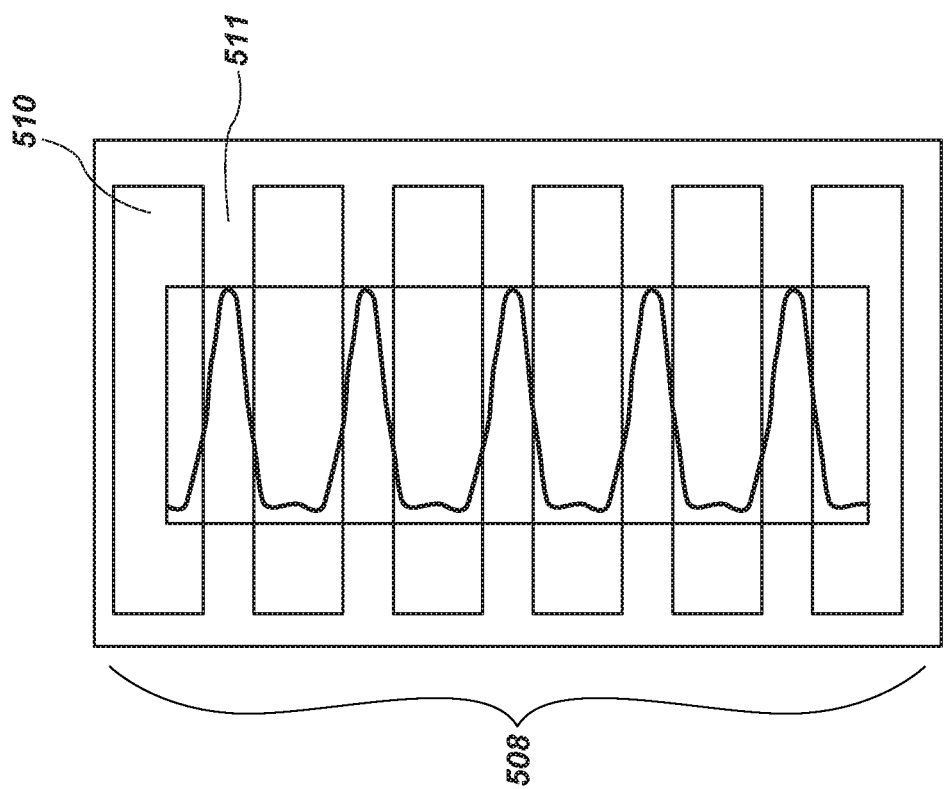
FIG. 5B is a schematic representation of a contrast curve as determined by an overlay metrology measurement system.
Figure 5A:
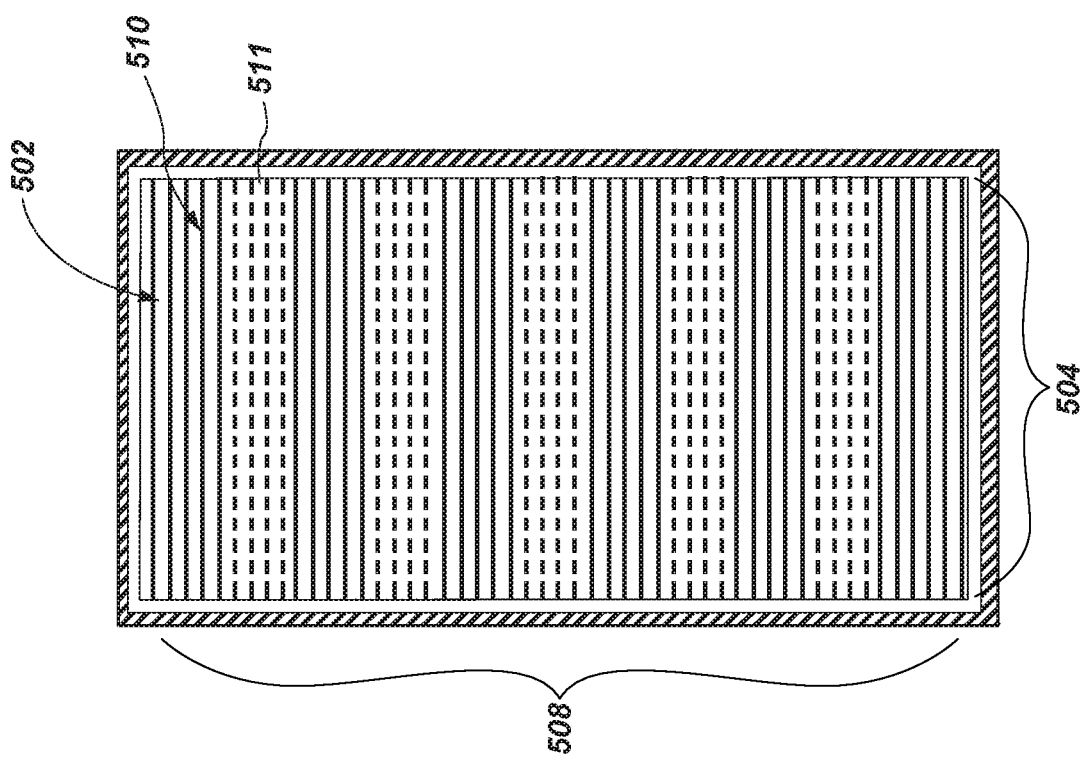
FIG. 5A is a schematic view of a pattern of a portion (e.g., a column) of an overlay mark according to one or more embodiments of the present disclosure.
Figure 5C:
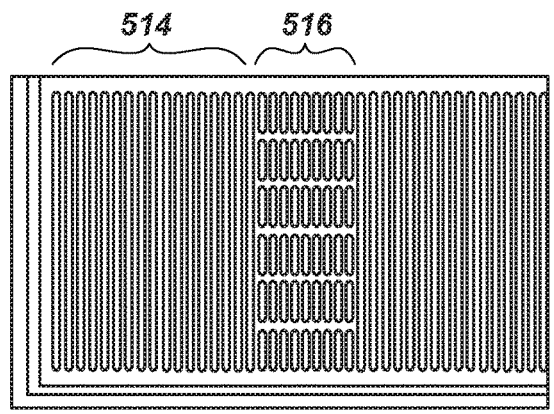
FIG. 5C is an enlarged partial view of the pattern of the overlay mark of FIG. 5A.
Figure 5D:
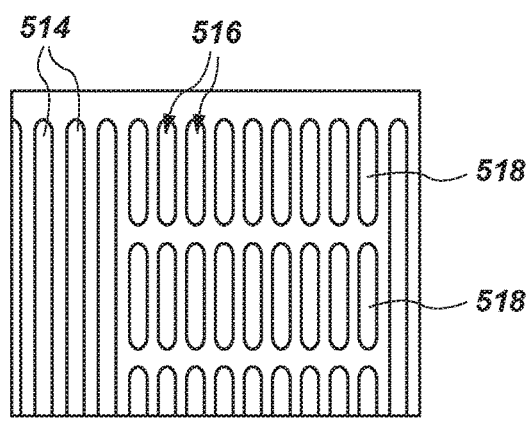
FIG. 5D is an enlarged partial view of the pattern of FIG. 5C.
Figure 5E:
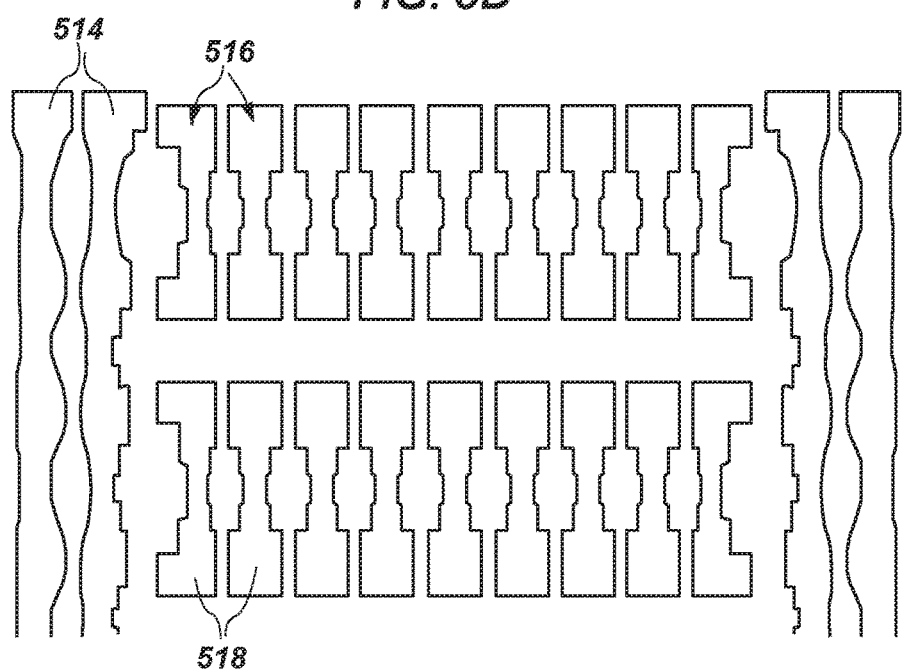
FIG. 5E is a design view of a portion of the pattern of FIG. 5A.

FIG. 5A shows an example pattern 502 (e.g., a light space pattern) defining bar marks 510 of a column 508 of an overlay mark according to one or more embodiments of the present disclosure. FIG. 5B shows an example contrast curve that may be detected from the overlay mark of FIG. 5A via an imager system (e.g., the imager sensor 102 of FIG. 1). FIG. 5C shows an enlarged view of a portion of a bar mark 510 and portion of a space mark 511 of the pattern 502. FIG. 5D shows yet a further enlarged view of the portion of the bar mark 510 and space mark 511 of FIG. 5C. FIG. 5E depicts a schematic view of a design of a portion of the pattern 502.

Referring to FIGS. 5A-5E together, in some embodiments, the pattern 502 may include bar marks 510 separated by space marks 511. Each of the bar marks 510 may include parallel lines 514 (e.g., multiple parallel lines) extending from a first lateral side of the column 508 to an opposite, second lateral side of the column 508. In one or more embodiments, the parallel lines 504 may extend in a direction perpendicular to a height of the column 508. In some embodiments, the spaces between the parallel lines 504 may be smaller than widths of the parallel lines 504 themselves such that the pattern 502 within the bar marks 510 is substantially continuous along widths of the bar mark 510.

Furthermore, each of the space marks 511 may include parallel segmented lines 516. Each segmented line 516 may include segments 518. Additionally, the segments 518 of each segmented line 516 may align with correlating segments 518 of the other segmented lines 516 of a respective space mark 511. As a result, a collection of correlating segments amongst the parallel segmented lines 516 may form respective columns 508. In one or more embodiments, longitudinal lengths of each segment 518 of each segmented line 516 may be significantly longer than spaces between adjacent segments 518. For instance, each segment 518 may have a longitudinal length within a range of about 0.20 μm and about 0.25 μm. For example, each segment 518 may have a longitudinal length within a range of about 0.217 μm and about 0.240 μm. In some embodiments, the segments 518 may vary in length. For instance, outer segments (i.e., segments near the parallel lines 514) may be shorter in length and inner segments (i.e., segments remote from the parallel lines 514) may be longer in length. Additionally, a distance between adjacent segments 518 may be within a range of about 0.08 μm and about 0.10 μm. For example, a distance between adjacent segments 518 may be about 0.0945 μm. Furthermore, a distance between a last parallel line 504 of a bar mark 510 and a first segmented line 516 of a space mark 511 may be a larger distance than a distance between adjacent parallel lines 504 of a bar mark 510 and is between adjacent segmented lines 516 of a space mark 511. In some embodiments, distances between adjacent parallel lines 504 of a bar mark 510 may vary. However, there is no interruption in the pattern 502 between bar marks 510 and space marks 511 within the pattern 502.

The pattern 502 may be formed on (e.g., transferred to) the wafer 114 via any conventional method. Additionally, the pattern 502 may include conventional materials utilized for overlay marks detectable and visible via conventional optical scanners and formed by conventional methods. For example, the pattern 502 may include fill material, recesses, plating, or any other structure types conventionally utilized in forming overlay marks 204.

In one or more embodiments, the differences of the pattern 502 of the bar marks 510 and the pattern 502 of the space marks 511 may yield distinguishable levels of contrast between the bar marks 510 and the space marks 511 when scanned via conventional methods and when identifying/determining a contrast curve for the pattern 502 of the column 508 of the overlay mark, as shown in FIG. 5B. However, because the spaces between adjacent parallel lines 504, the spaces between adjacent segmented lines 516, and the spaces between parallel lines and segmented lines do not vary, the pattern is at least substantially continuous and does not include any interruptions in pattern that may be susceptible to damage during processing.

Figure 6B:
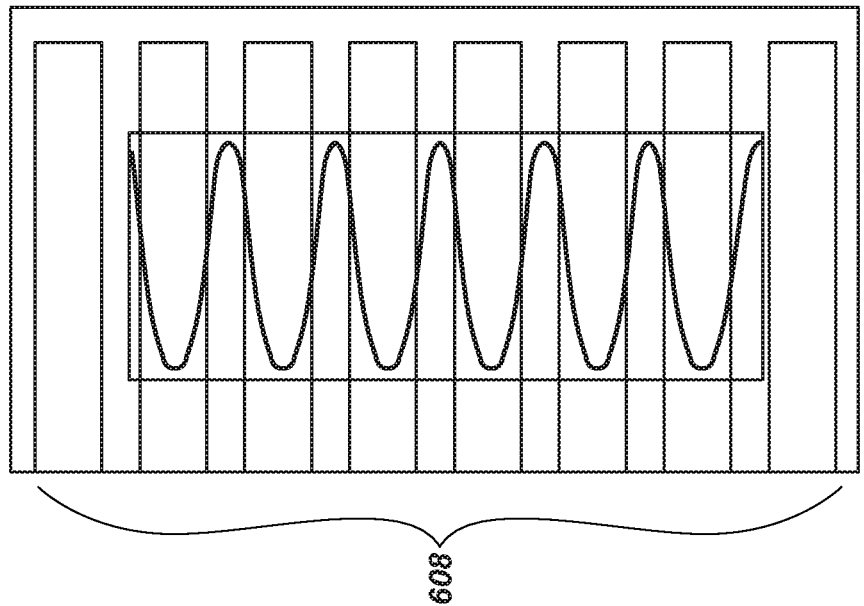
FIG. 6B is a schematic representation of a contrast curve as determined by an overlay metrology measurement system.
Figure 6A:
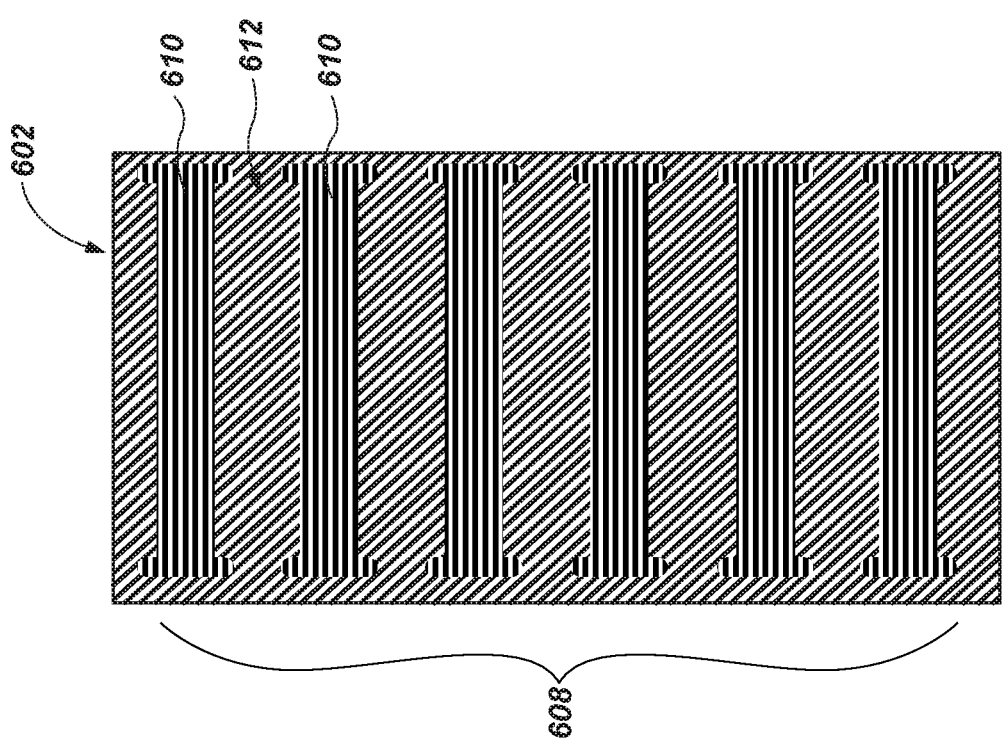
FIG. 6A is a schematic view of a pattern of a portion (e.g., a column) of an overlay mark according to one or more embodiments of the present disclosure.

FIG. 6A shows an example pattern 602 (e.g., a light space pattern) defining conventional bar marks 610 of a column 608 of an overlay mark according to one or more embodiments of the present disclosure. FIG. 6B shows an example contrast curve that may be detected from the overlay mark of FIG. 6A via an imager system (e.g., the imager sensor 102 of FIG. 1). The pattern 602 may include conventional bar marks 610 but may have an extended fill pattern 612 contacting and at least substantially filling spaces between the conventional bar marks 610. The conventional bar marks 610 may include parallel lines. The pattern 602 may be formed via any of the manners and methods described above in regard to FIGS. 3A-5E and may include any of the materials and pattern structures described herein. Furthermore, the pattern 602 may be scanned and detected via any of the manners described herein.

Figure 7:
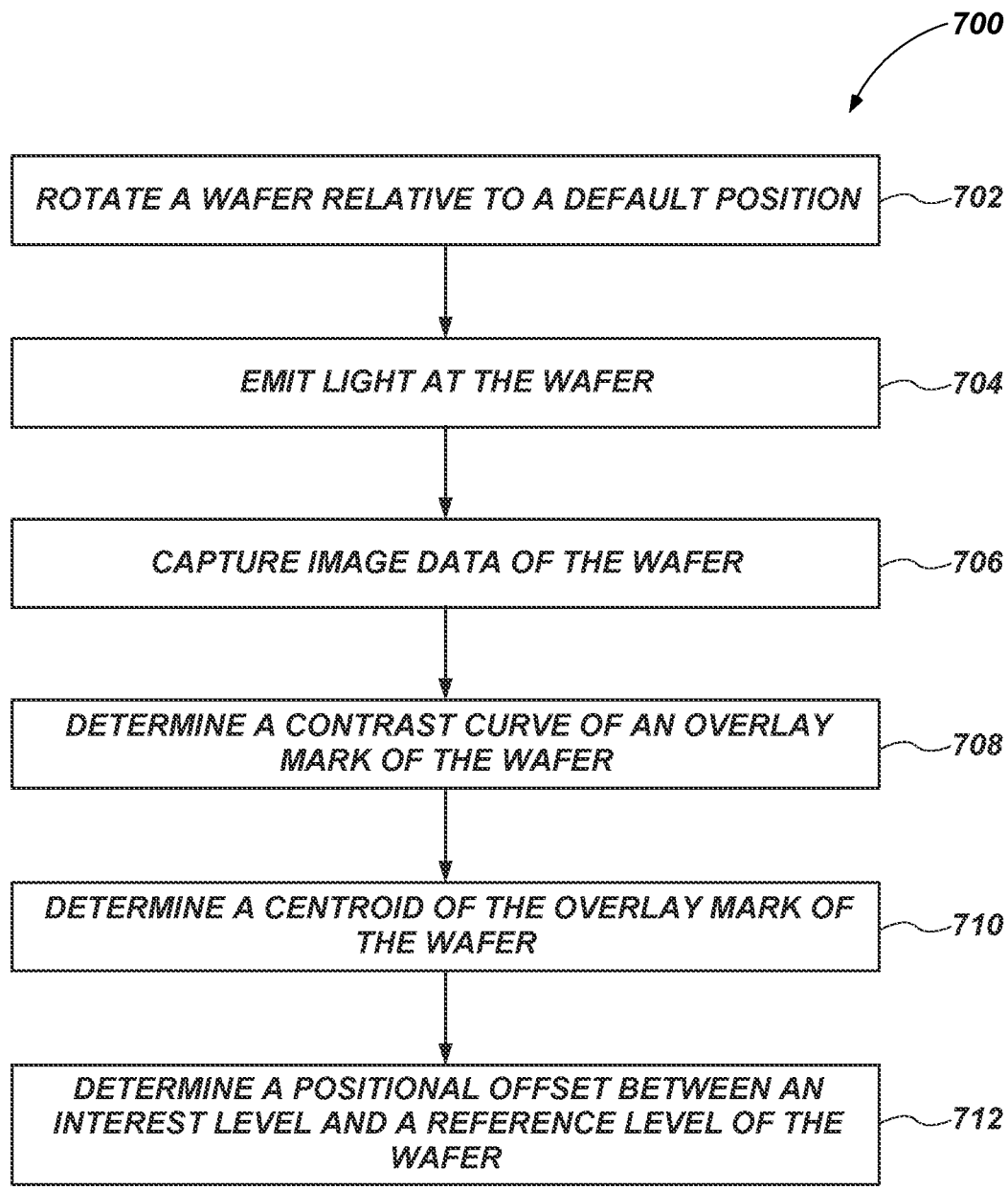
FIG. 7 is a flow diagram of a method for determining an overlay measurement between a reference level and an interest level of a wafer according to one or more embodiments of the present disclosure.

FIG. 7 shows a flow chart of an example method 700 for detecting locations of overlay marks and for determining an overlay measurement according to one or more embodiments of the present disclosure.

In some embodiments, the method 700 may include rotating a wafer on a wafer chuck of an overlay metrology measurement system 100 (FIG. 1), as shown in act 702 of FIG. 7. In one or more embodiments, the wafer may have overlay marks formed on a reference level of the wafer and an interest level of the wafer. For example, the overlay marks may include any of the overlay marks described above in regard to FIGS. 3A-4B. In particular, the overlay marks may include light space patterns defining bar marks of columns. Furthermore, the patterns may include sets of lines defining adjacent regions where the lines extend at a first angle relative to a longitudinal axis of the column within regions representing bar marks, and where the lines extend longitudinally at a second angle relative to the longitudinal axis of the column regions representing spaces between marks. The first and second angles may include any of the angles described above in regard to FIGS. 3A-4B.

In some embodiments, rotating the wafer may include rotating the wafer about a central axis by an angle relative to a default position (e.g., a default position of a wafer chuck). For instance, rotating the wafer may include rotating the wafer by an angle equal to the first angle described above in regard to FIGS. 3A and 4A. For example, rotating the wafer may include rotating the wafer by 45°. In other embodiments, rotating the wafer may include rotating the wafer by 15°, 30°, 60°, 75°, 90°, or any other angle. In one or more embodiments, the wafer may be rotated to a position such that light emitted by the overlay metrology measurement system 100 (described below) will be emitted in a direction perpendicular to the portions of lines of the pattern extending at the first angle and in a direction parallel to the portions of the lines of the pattern extending at the second angle. Alternatively, the method 700 may include rotating the polarizer 110 of the overlay metrology measurement system 100 (FIG. 1) instead of or in addition to rotating the wafer such that polarized light emitted by the overlay metrology measurement system 100 (described below) will be emitted in a direction perpendicular to the portions of lines of the pattern extending at the first angle and in a direction parallel to the portions of the lines of the pattern extending at the second angle.

The method 700 may further include emitting light at the wafer, as shown in act 704 of FIG. 7. For example, as noted above, the overlay metrology measurement system 100 may emit the light at the wafer in a direction perpendicular to the portions of lines of the pattern of the overlay marks extending at the first angle and in a direction parallel to the portions of the lines of the pattern of the overlay marks extending at the second angle. The light may include any of the types of lights and/or radiation described above.

Upon emitting light at the wafer, the method 700 may include capturing image data (e.g., at least one image) of the wafer, as shown in act 706 of FIG. 7. For example, the overlay metrology measurement system 100 may capture at least one image of the wafer via an imager sensor (e.g., imager sensor 102) via any conventional manner.

Based at least partially on the captured at least one image of the wafer, the method 700 may include determining contrast curves of the overlay marks of the wafer, as shown in act 708 of FIG. 7. For example, the overlay metrology measurement system 100 may determine a contrast curve for an overlay mark on the reference level of the wafer and a contrast curve for a correlating overlay mark on the interest level of the wafer via conventional methods.

Upon determining the contrast curves of the overlay marks of the wafer, the method 700 may include determining locations of centroids of the overlay marks based at least partially on the contrasts curves, as shown in act 710 of FIG. 7. For instance, the overlay metrology measurement system 100 may determine a location of centroid of the first overlay mark on the reference level of the wafer and a location centroid of the second overlay mark on the interest level of the wafer via conventional methods. In other embodiments, the overlay metrology measurement system 100 may identify locations of a side, an edge, a point, or any other feature the overlay marks. Furthermore, based on the determined locations of the centroid and/or features of the overlay marks, locations and orientations of the overlay marks may be calculated and determined.

In response to determining locations of the centroids (or any other feature) of the of the overlay marks, the method may include calculating a positional offset (e.g., an overlay measurement) between the interest level and the reference level of the wafer, as shown in act 712 of FIG. 7. For instance, based on the locations of the centroids (or any other features) of the first overlay mark of the reference level and the second overlay mark of the interest level, the overlay metrology measurement system 100 may calculate or may be used to calculate the positional offset via conventional methods. As a non-limiting example, the method 700 may include calculating the positional offset based on two overlay marks via any of the methods described in U.S. Pat. No. 6,779,171, to Baggenstoss, issued Aug. 17, 2004, U.S. Pat. No. 6,778,275 to Bowes, issued Aug. 17, 2004, and/or U.S. Pat. No. 7,463,367, to Bowes, issued Dec. 9, 2008. In addition to calculating offsets, various mathematical models may be applied to interpolate and extrapolate obtained data to generate a geometrical model of the layer overlay.

In some embodiments, any of the acts 702-712 of FIG. 7 may be repeated multiple times to calculate a positional offset between the interest level and the reference level of the wafer. In some embodiments, further overlay marks may be applied to a higher interest level, and acts 702-712 of FIG. 7 may be repeated to recalibrate wafer alignment and make further overlay measurement. Empirical data as a given batch of wafers is processed may be employed to determine with what frequency, and at which levels it is most useful to perform an overlay measurement according to the disclosure.

Additionally, the method 700 may include adjusting future semiconductor fabrication processes on the wafer based on the calculated positional offset (i.e., overlay measurement). For instance, the overlay metrology measurement system 100 may be used to adjust relative wafer and tool positions in future processes such as forming overlying material levels, patterning, etching, etc., based on the calculated positional offset via conventional methods.

Figure 8:
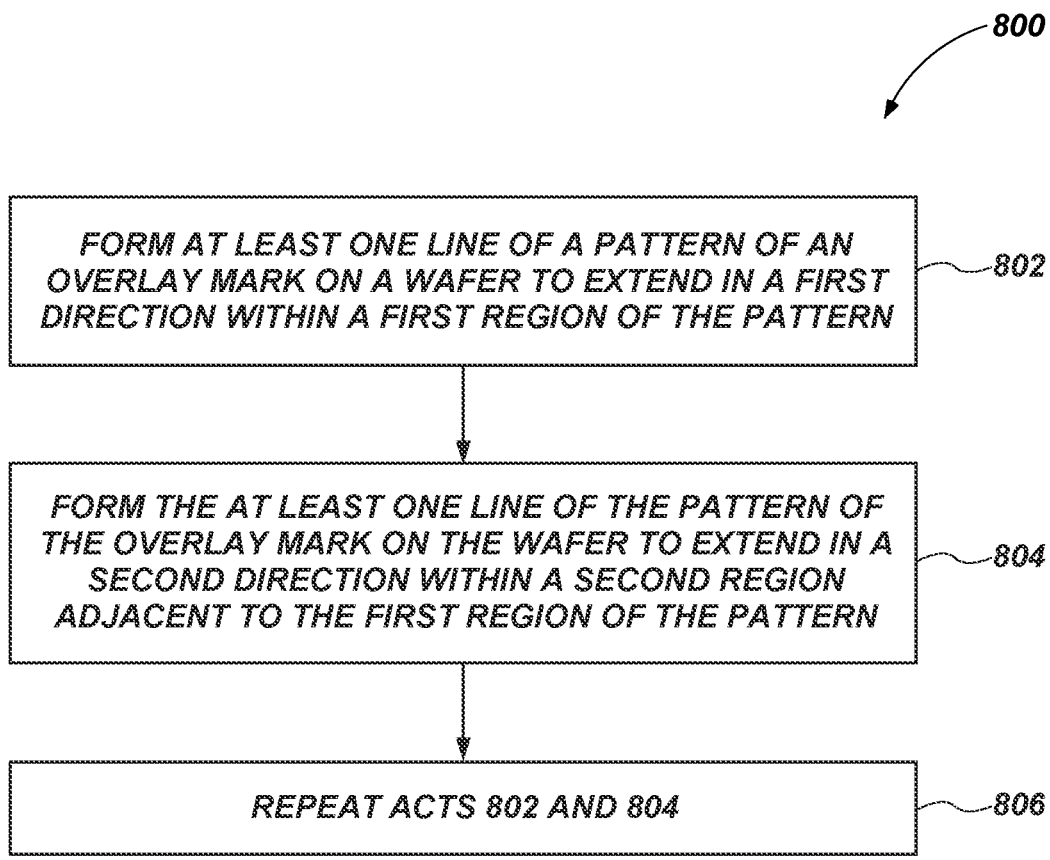
FIG. 8 is a flow diagram of a method of forming an overlay mark according to one or more embodiments of the present disclosure.

FIG. 8 shows a flow chart of an example method 800 for forming an overlay mark on a wafer according to one or more embodiments of the present disclosure. In some embodiments, the method 800 may include forming at least one line of a pattern on a wafer to extend in a first direction within a first region of the pattern, as shown in act 802 of FIG. 8. For instance, a photolithography system may form the at least one line of the pattern of the overlay mark on a surface of wafer. In one or more embodiments, the first direction may extend at an angle relative to a longitudinal axis of a column of the pattern. The first angle may be within a range of 0° to 90°. For example, the first angle may be about 45°

In some embodiments, forming the pattern on the wafer may include depositing material on the wafer via conventional methods, forming recesses within the wafer via conventional methods, plating the wafer in conventional methods, dry etch processes, film deposition processes, chemical-mechanical polishing processes, etc. For example, in some embodiments, the pattern on the wafer may include fill material or any other conventional materials. In some embodiments, forming the pattern on the wafer may include multiple steps separated by one or more other processes. For instance, portions of the pattern may be formed downstream from a first step of forming the pattern.

The method 800 may further include forming the at least one line of the pattern on the wafer to extend in a second direction within a second region adjacent to the first region of the pattern, as shown in act 804 of FIG. 8. For instance, the photolithography system may form the at least one line of the pattern of the overlay mark on a surface of wafer. Furthermore, the second direction may be perpendicular to the first direction. As a result, the portion of the at least one line of the pattern within the first region may form a 90° angle with the portion of the at least one line of the pattern within the second region. Moreover, the second direction may extend at an angle relative to the longitudinal axis of the column of the pattern. The second angle may be within a range of 90° to 180°. For example, the first angle may be about 135°

In one or more embodiments, the second region may be directly adjacent to the first region in a direction of the longitudinal axis of the column design of the pattern. Furthermore, in some embodiments, the first and second regions may have substantially the same widths along the longitudinal axis of the column design of the pattern. In other embodiments, first and second regions may have differing (e.g., variable) widths along the longitudinal axis of the column design of the pattern.

Furthermore, the method 800 may include repeating acts 802 and 804 to form a set of adjacent regions defining a column of the pattern, as shown in act 806 of FIG. 8. For example, the photolithography system may repeat acts 802 and 804 to form a set of adjacent regions to define a column of the pattern. Additionally, a direction in which the at least one line of the pattern may alternate throughout the regions. For example, the at least one line may extend in the first direction within the first region, in the second direction within the second region, in the first direction within a third region, in the second direction within the fourth region, etc. Moreover, repeating acts 802 and 804 may include forming the at least one line to be continuous throughout the regions of the column of the pattern. Likewise, repeating acts 802 and 804 may include forming the at least one line to have a periodic shape.

Referring to acts 802-806 together, in some embodiments, the method 800 may include forming a set of parallel lines according to acts 802-806 to define bar marks and space marks as described above in regard to FIGS. 3A-4B.

Figure 9:
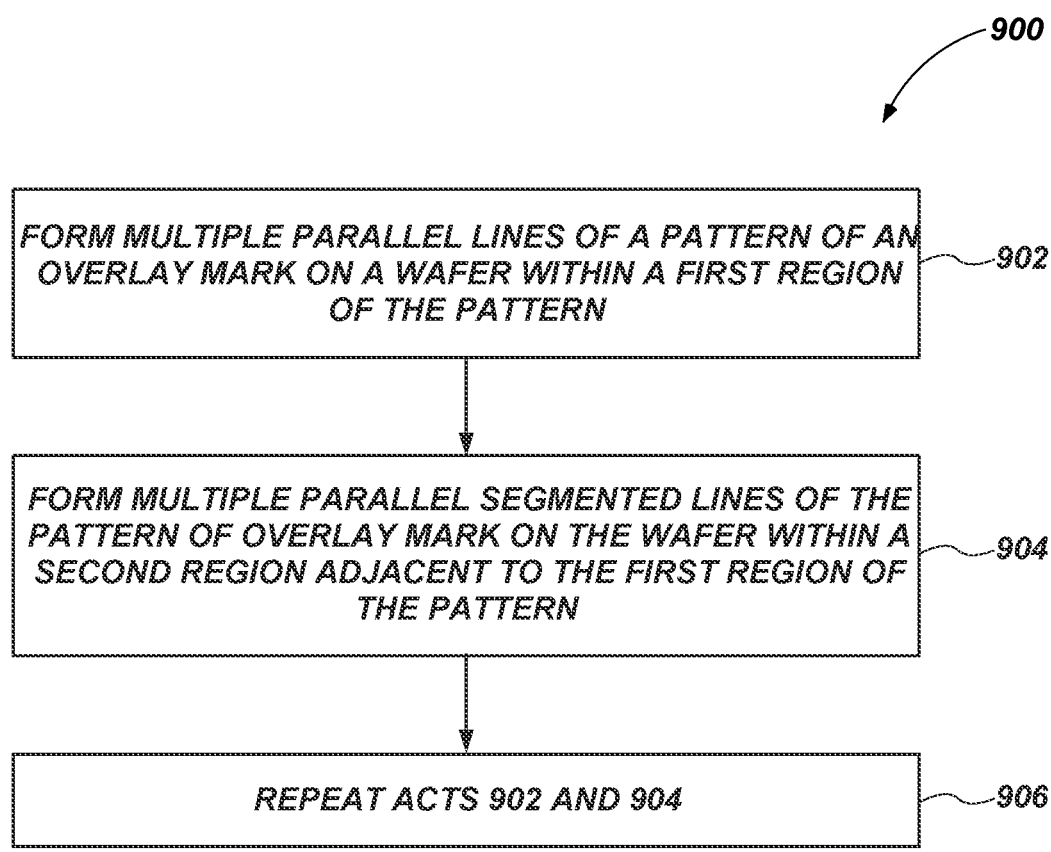
FIG. 9 is a flow diagram of a method of forming an overlay mark according to one or more embodiments of the present disclosure.

FIG. 9 shows a flow chart of an example method 900 for forming an overlay mark on a wafer according to one or more embodiments of the present disclosure. In some embodiments, the method 800 may include forming multiple parallel lines of a pattern on a wafer within a first region of the pattern, as shown in act 902 of FIG. 9. For instance, the photolithography system may form the multiple parallel lines of the pattern of the overlay mark on a surface of wafer. In some embodiments, the multiple parallel lines may extend from a first lateral side of a column design of the pattern to an opposite, second lateral side of the column design of the pattern. In one or more embodiments, forming the parallel lines may include forming the parallel lines to extend in a direction perpendicular to a height of the column design. In some embodiments, forming the parallel lines may include forming the parallel lines to have spaces between the parallel lines that are smaller than widths of the parallel lines themselves such that the pattern formed by the parallel lines is substantially continuous throughout the first region.

In one or more embodiments, the method 900 may include forming multiple parallel segmented lines of the pattern on the wafer within a second region of the pattern, as shown in act 904 of FIG. 9. For instance, the photolithography system may form the multiple parallel segmented lines of the pattern of the overlay mark on the surface of wafer. In some embodiments, the multiple segmented parallel lines may extend from the first lateral side of a column design of the pattern to the opposite, second lateral side of the column design of the pattern. In one or more embodiments, forming the parallel segmented lines may include forming the parallel segmented lines such that segments of each segmented line align with correlating segments of the other segmented lines within the second region. Additionally, forming the parallel segmented lines may include forming the parallel segmented lines such that longitudinal lengths of each segment of each segmented line is significantly longer than spaces between adjacent segments of the segmented lines.

Additionally, act 904 may include forming the parallel segmented lines on the surface of the wafer such that the segmented lines within the second region are parallel to the parallel lines of the first region. Moreover, act 904 may include forming the parallel segmented lines such that a distance between an adjacent parallel line of the first region and a segmented line of the second region may be a same distance as is between adjacent parallel lines of the first region and as is between adjacent segmented lines of the second region. As a result, there is no interruption in the pattern between the first regions (e.g., a bar mark) and the second region (e.g., a space mark).

In one or more embodiments, the second region may be directly adjacent to the first region in a direction of the longitudinal axis of the column design of the pattern. Furthermore, in some embodiments, the first and second regions may have substantially the same widths along the longitudinal axis of the column design of the pattern. In other embodiments, first and second regions may have differing (e.g., variable) widths along the longitudinal axis of the column design of the pattern.

In some embodiments, the method 900 may include repeating acts 902 and 904 to form set of adjacent regions defining a column of the pattern, as shown in act 906 of FIG. 8. For example, the photolithography system may repeat acts 902 and 904 to form a set of adjacent regions to define a column of the pattern. In some embodiments, the photolithography system may form multiple parallel lines within the first region, multiple parallel segmented lines within the second region, multiple parallel lines within a third region, multiple parallel segmented lines within the fourth region, etc. Moreover, repeating acts 902 and 904 may include forming an at least substantially continuous pattern throughout the regions of the column without interruption in the pattern between regions.

Referring to acts 902-906 together, in some embodiments, the method 900 may include forming a pattern to define bar marks and space marks as described above in regard to FIGS. 5A-5E.

Figure 10:
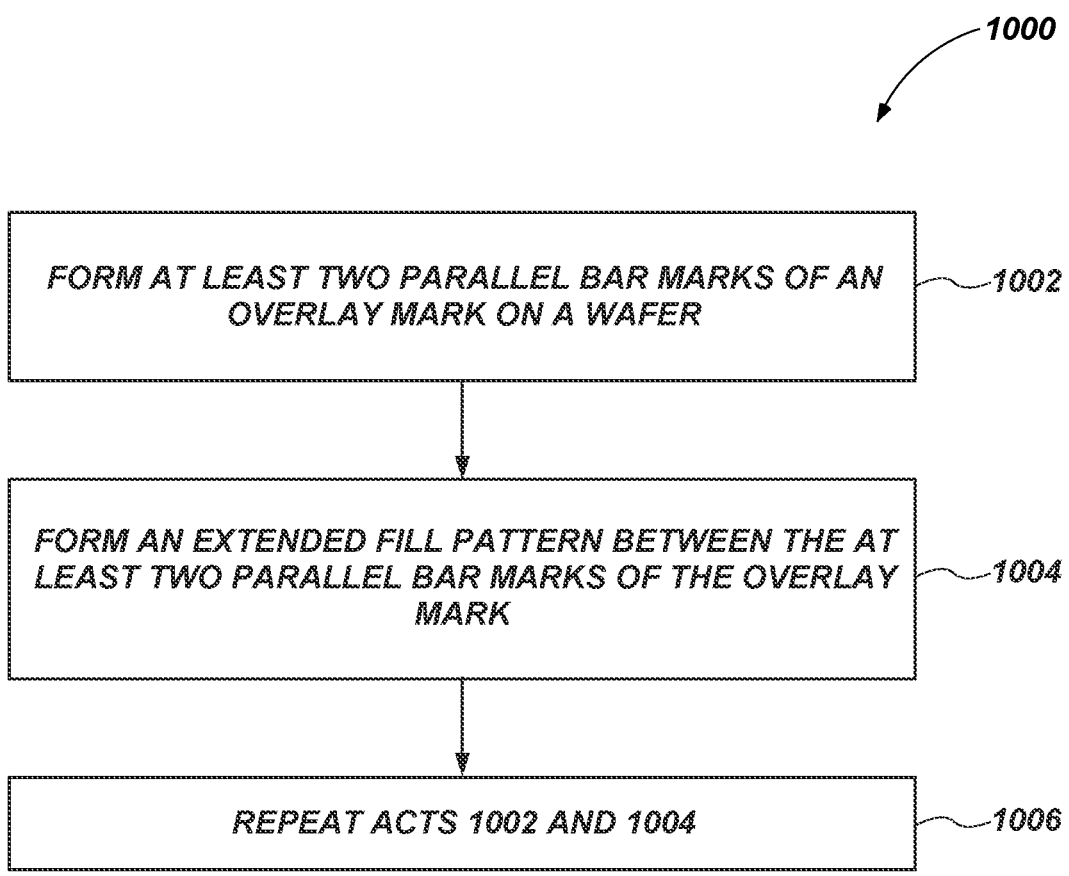
FIG. 10 is a flow diagram of a method of forming an overlay mark according to one or more embodiments of the present disclosure.

FIG. 10 shows a flow chart of an example method 1000 for forming an overlay mark on a wafer according to one or more embodiments of the present disclosure. In some embodiments, the method 1000 may include forming at least two parallel bar marks on wafer, as shown in act 1002 of FIG. 10. For instance, the photolithography system may form the at least two parallel bar marks on wafer. In one or more embodiments, the photolithography system may form the at least two parallel bar marks according to conventional methods.

The method 1000 may further include forming an extended fill pattern between the at least two parallel bar marks, as shown in act 1004 of FIG. 10. For example, the photolithography system may form the extended fill pattern between the at least two parallel bar marks. In one or more embodiments, act 1004 may include forming the extended fill pattern to contact each of the at least two parallel bar marks and to at least substantially fill a space between adjacent bar marks of the at least two parallel bar marks.

Furthermore, the method 1000 may include repeating acts 1002 and 1004 to form a set of adjacent bar marks defining a column, as shown in act 1006 of FIG. 8. For example, the photolithography system may repeat acts 1002 and 1004 to form bar marks and an extended fill pattern as described above in regard to FIGS. 6A and 6B.

Referring to FIGS. 1-10 together, the overlay marks and patterns for forming overlay marks described herein provide advantages over conventional overlay marks and patterns. For example, conventional overlay marks typically include interruptions in the pattern (e.g., absences of pattern) to assist in differentiating between portions of the pattern (e.g., bar marks). However, these interruptions (or the edges of the pattern defining the interruptions) are commonly damaged during conventional processing procedures. The damaged interruptions adversely affect overlay measurements. The overlay marks and patterns for forming overlay marks of the present disclosure, however, do not include the above-described interruptions and are at least substantially continuous. Furthermore, due to the shape and design of the patterns described herein, the patterns maintain a detectability and differentiability (e.g., optical contrast) of portions of the patterns when scanned via an imager system. Therefore, because the overlay marks and patterns for forming overlay marks remove any need for interruptions for detecting portions of the overlay marks, the overlay marks and patterns for forming overlay marks of the present disclosure may provide more robust and reliable overlay marks that may endure processing better than conventional overlay marks. Accordingly, the overlay marks and patterns for forming overlay marks of the present disclosure may result in more accurate overlay measurements, which results in better processing and higher quality semiconductor devices.

One or more embodiments of the present disclosure include a method of determining an overlay measurement (e.g., a positional offset) between an interest level of a wafer and a reference level of the wafer. The method may include orienting a wafer (e.g., rotating a wafer on a wafer chuck) within an overlay metrology measurement system to align portions of lines of a pattern of an overlay mark with a direction in which an illumination source of the overlay metrology measurement system emits light (e.g., radiation) at the wafer. Furthermore, orienting the wafer may include aligning other portions of the lines of the pattern of the overlay mark to extend in a direction perpendicular to the direction in which the illumination source of the overlay metrology measurement system emits light at the wafer. The method further includes emitting light at the wafer via the illumination source, and capturing at least one image of the wafer via an imager sensor of the overlay metrology measurement system. The method also include determining, based at least partially on the captured at least one image, contrasts of regions of the overlay mark and based on the determined contrasts determining a location of the overlay mark. Moreover, the method may include determining a location of an overlay mark of a reference level of the wafer and a location of an overlay mark of an interest level of the wafer via the above-described method. Furthermore, based on the determined locations of the overlay marks, the overlay metrology measurement system may determine a positional offset between the reference level and the interest level of a wafer.

Some embodiments of the present disclosure include an overlay mark utilized to determine a positional offset between the reference level and the interest level of a wafer. The overlay mark may include a pattern defining an array of columns, each column comprising a set of parallel bar marks wherein each bar mark is spaced apart from an adjacent bar mark by a space mark. Furthermore, the pattern within each column of the array of columns may include a set of lines oriented parallel to each other and extending in a first direction within each bar mark of a respective column and extending in a second different direction in each space mark of the respective column. Each line of the set of lines may be continuous and may extend from an uppermost region of the respective column to a lowermost region of the respective column. Furthermore, the first direction may be perpendicular to the second direction.

One or more embodiments of the present disclosure include an overlay metrology measurement system. The overlay metrology measurement system may include a substrate support for supporting a wafer, an illumination source for emitting light at the wafer in a first direction, an imager sensor configured to recognize at least locations of visible elements on a wafer, a controller operably coupled to the substrate support, the imager sensor, and the illumination source. The controller may include at least one processor and at least one non-transitory computer-readable storage medium storing instructions thereon that, when executed by the at least one processor, cause the controller to: cause the support substrate to rotate the wafer relative to a default position to: align lines of a first region of a pattern of an overlay mark on a reference level of the wafer with the first direction; and cause lines of a second region adjacent to the first region of the pattern of the overlay mark to extend in a second direction perpendicular to the first direction; cause the illumination source to emit light at the wafer in the first direction; cause the imager sensor to capture at least one image of the wafer; and based at least partially on the capture at least one image, differentiating the first region from the second region of the pattern of the overlay mark based on detected contrasts of the first region and the second region of the overlay mark.

Further embodiments of the present disclosure include methods of forming a pattern of an overlay mark on a wafer. The methods may include forming bar marks of columns of an overlay mark and forming space marks of columns of the overlay mark. Forming the bar marks of the columns may include forming parallel lines extending from a first lateral end of a respective column to a second opposite lateral end of the respective column. Forming the space marks of the columns may include forming, between adjacent bar marks, parallel segmented lines extending from the first lateral end of the respective column to the second opposite lateral end of the respective column.

The embodiments of the disclosure described above and illustrated in the accompanying drawings do not limit the scope of the disclosure, which is encompassed by the scope of the appended claims and their legal equivalents. Any equivalent embodiments are within the scope of this disclosure. Indeed, various modifications of the disclosure, in addition to those shown and described herein, such as alternate useful combinations of the elements described, will become apparent to those skilled in the art from the description. Such modifications and embodiments also fall within the scope of the appended claims and equivalents.

What is claimed is:

1. A method, comprising:
    orienting a wafer to align lines of a first region of a pattern of an overlay mark with a direction in which an illumination source emits light at the wafer, the overlay mark comprising the pattern defining an array of columns, each column of the array of columns respectively comprising some of the lines oriented parallel to each other and individually continuously extending in a non-linear path from an end of the column in a first direction to an additional end of the column in the first direction, the some of the lines comprising:
        regions each linearly extending in a second direction acutely angled relative to the first direction and defining bar marks of the column, the bar marks each having substantially the same width in the first direction and oriented parallel to one another in a third direction perpendicular to the first direction; and
        additional regions alternating with the regions in the first direction and each linearly extending in a fourth direction obtusely angled relative to the first direction, the additional regions defining space marks of the column each having substantially the same additional width in the first direction and oriented parallel to one another in the third direction;
    emitting light at the wafer via the illumination source;
    capturing at least one image of the wafer via an imager sensor; and
    based at least partially on the captured at least one image, determining a contrast of a second region of the pattern of the overlay mark where additional lines of the pattern are not aligned with the direction in which the illumination source emits light at the wafer and determining a contrast of the first region of the pattern of the overlay mark.

2. The method of claim 1, wherein orienting the wafer comprises rotating the wafer by about 45° relative to a default position of the wafer in order to align the lines of the first region of the pattern of the overlay mark with the direction in which the illumination source emits light at the wafer.

3. The method of claim 1, wherein orienting the wafer comprises rotating the wafer by about 45° relative to a default position of the wafer in order to cause the additional lines of the second region of the pattern of the overlay mark to extend in a direction perpendicular to the direction in which the illumination source emits light at the wafer.

4. The method of claim 1, further comprising, based at least partially on the determined contrasts of the first and second regions, determining a location of a centroid of the overlay mark.

5. The method of claim 4, further comprising determining a positional offset of the overlay mark relative of another registration formed on another level of the wafer based at least partially on the determined location of the centroid of the overlay mark.

6. The method of claim 1, wherein determining contrasts of the first and second regions of the pattern of the overlay mark comprises determining a contrast level between the second region and a surrounding area of the wafer that is higher than a contrast level between the first region and the surrounding area of the wafer.

7. The method of claim 1, wherein orienting a wafer to align lines of the first region of the pattern of an overlay mark with the direction in which the illumination source emits light at the wafer and emitting light at the wafer via the illumination source effectuates a polarizing filter when imaged via the image sensor of at least one of the first region or the second region.

8. The method of claim 1, wherein further comprising, based at least partially on the determined contrasts of the first and second regions, determining a location and shape of at least one of the bar marks of the overlay mark.

9. The method of claim 1, wherein further comprising, based at least partially on the determined contrasts of the first and second regions, determining a location and shape of at least one of the columns of the array of columns of the overlay mark.

10. An overlay mark of a wafer, comprising:
    a pattern defining an array of columns, each column of the array of columns respectively comprising lines oriented parallel to each other and individually continuously extending in a non-linear path from an end of the column in a first direction to an additional end of the column in the first direction, the lines comprising:
        regions each linearly extending in a second direction acutely angled relative to the first direction and defining bar marks of the column, the bar marks each having substantially the same width in the first direction and oriented parallel to one another in a third direction perpendicular to the first direction; and
        additional regions alternating with the regions in the first direction and each linearly extending in a fourth direction obtusely angled relative to the first direction, the additional regions defining space marks of the column each having substantially the same additional width in the first direction and oriented parallel to one another in the third direction.

11. The overlay mark of the wafer of claim 10, wherein:
    the second direction extends at an angle of 45° relative to the first direction; and
    the fourth direction extends at angle of 135° relative to the first direction.

12. The overlay mark of the wafer of claim 10, wherein the width of each of the bar marks is substantially equal to the additional width of each of the spark marks.

13. The overlay mark of the wafer of claim 10, wherein the width of each of the bar marks is greater than the additional width of each of each of the spark marks.

14. The overlay mark of the wafer of claim 10, wherein the pattern comprises one of more of fill material, recesses, and plating.

15. An overlay metrology measurement system, comprising:
  a substrate support for supporting a wafer;
  an illumination source for emitting light at the wafer in a first direction;
  an imager sensor configured to recognize at least locations of visible elements on a wafer; and
  a controller operably coupled to the substrate support, the imager sensor, and the illumination source, the controller comprising:
    at least one processor; and
    at least one non-transitory computer-readable storage medium storing instructions thereon that, when executed by the at least one processor, cause the controller to:
      cause the support substrate to rotate the wafer relative to a default position to:
        align lines of a first region of a pattern of an overlay mark on a reference level of the wafer with the first direction, the pattern of the overlay mark defining an array of columns, each column of the array of columns respectively comprising some of the lines oriented parallel to each other and individually continuously extending in a non-linear path from an end of the column in a first direction to an additional end of the column in the first direction, the some of the lines comprising:
          regions each linearly extending in a second direction acutely angled relative to the first direction and defining bar marks of the column, the bar marks each having substantially the same width in the first direction and oriented parallel to one another in a third direction perpendicular to the first direction; and
          additional regions alternating with the regions in the first direction and each linearly extending in a fourth direction obtusely angled relative to the first direction, the additional regions defining space marks of the column each having substantially the same additional width in the first direction and oriented parallel to one another in the third direction;
      cause additional lines of a second region adjacent to the first region of the pattern of the overlay mark to extend in the second, different direction perpendicular to the first direction;
      cause the illumination source to emit light at the wafer in the first direction;
      cause the imager sensor to capture at least one image of the wafer; and
      based at least partially on the capture at least one image, differentiating the first region from the second region of the pattern of the overlay mark based on detected contrasts of the first region and the second region of the overlay mark.

16. The overlay metrology measurement system of claim 15, wherein the controller further comprises instructions that, when executed by the at least one processor, cause the controller to, based at least partially on the detected contrasts of the first and second regions, determining a location of a centroid of the overlay mark on the reference level of the wafer.

17. The overlay metrology measurement system of claim 16, wherein the controller further comprises instructions that, when executed by the at least one processor, cause the controller to:
  determine a location of another centroid of another overlay mark on an interest level of the wafer; and
  based on the determined location of the overlay mark on the reference level and the determined location of the overlay mark on the interest level, determining a positional offset between the interest level and the reference level of the wafer.

18. The overlay metrology measurement system of claim 15, wherein aligning lines of a first region of the pattern of the overlay mark on the reference level of the wafer with the first direction comprises rotating the wafer 45° relative to a default position of the wafer.

19. The overlay metrology measurement system of claim 15, wherein aligning lines of a first region of the pattern of the overlay mark on the reference level of the wafer with the first direction creates a polarization effect with light emitted by the illumination source causing the additional lines within the second region of the overlay mark to have a higher detectability via the imager sensor than the lines within the first region of the overlay mark.

* * * * *